United States Patent
Edo Vivancos et al.

(10) Patent No.: US 12,118,212 B2
(45) Date of Patent: Oct. 15, 2024

(54) SYSTEM AND METHOD FOR MEMORY COMPRESSION FOR DEEP LEARNING NETWORKS

(71) Applicant: THE GOVERNING COUNCIL OF THE UNIVERSITY OF TORONTO, Toronto (CA)

(72) Inventors: Isak Edo Vivancos, Toronto (CA); Andreas Moshovos, North York (CA); Sayeh Sharifymoghaddam, Toronto (CA); Alberto Delmas Lascorz, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 36 days.

(21) Appl. No.: 18/054,396

(22) Filed: Nov. 10, 2022

(65) Prior Publication Data
US 2023/0131251 A1    Apr. 27, 2023

Related U.S. Application Data

(63) Continuation of application No. PCT/CA2021/050664, filed on May 14, 2021.
(Continued)

(51) Int. Cl.
*G06F 3/06* (2006.01)
*G06F 12/02* (2006.01)

(52) U.S. Cl.
CPC .......... *G06F 3/0608* (2013.01); *G06F 3/0659* (2013.01); *G06F 3/0679* (2013.01); *G06F 12/0238* (2013.01); *G06F 2212/401* (2013.01)

(58) Field of Classification Search
CPC .... G06F 3/0608; G06F 3/0659; G06F 3/0679; G06F 12/0238; G06F 2212/401;
(Continued)

(56) References Cited

U.S. PATENT DOCUMENTS

2020/0026998 A1    1/2020  Maki et al.
2020/0050918 A1    2/2020  Chen et al.

OTHER PUBLICATIONS

Zhou, Aojun, et al., "Incremental network quantization: Towards lossless cnns with low-precision weights", CoRR, vol. abs/1702.03044, 2017. [Online]. Available: http://arxiv.org/abs/1702.03044.
(Continued)

*Primary Examiner* — Nanci N Wong
(74) *Attorney, Agent, or Firm* — Bhole IP Law; Anil Bhole; Marc Lampert

(57) ABSTRACT

A system and method for memory compression for deep learning networks. The method includes: compacting an input data stream by identifying a bit width necessary to accommodate the value from the input data stream with the highest magnitude; storing a least significant bits of the input data stream in a first memory store, the number of bits equal to the bit width, wherein if the value requires more bits than those currently left unused in the first memory store, the remaining bits are written into a second memory store; and outputting the value of the first memory store, as a consecutive part of a compressed data stream, with an associated width of the data in the first memory store when the first memory store becomes full and copying the value of the second memory store to the first memory store; and decompressing the compressed data stream.

20 Claims, 17 Drawing Sheets

Related U.S. Application Data

(60) Provisional application No. 63/024,907, filed on May 14, 2020.

(58) Field of Classification Search
CPC ..... G06F 2212/1024; G06F 2212/1044; G06F 2212/454; G06F 12/08; G06N 3/045; G06N 3/063; H03M 7/70; H03M 7/30
See application file for complete search history.

(56) References Cited

OTHER PUBLICATIONS

Zmora, Neta, et al., "Neural Network Distiller: A Python Package for DNN Compression Research", Jun. 2018. [Online]. Available: https://doi.org/10.5281/zenodo.1297430.

International Search Report for PCT application No. PCT/CA2021/050664, CIPO, search completed: Jul. 2, 2021, mailed Jul. 6, 2021.

Written Opinion of the International Searching Authority for PCT application No. PCT/CA2021/050664, CIPO, opinion completed: Jul. 5, 2021, mailed: Jul. 6, 2021.

Abali, B., et al., "Memory expansion technology (mxt): Software support and performance", IBM Journal of Research and Development, vol. 45, No. 2, pp. 287-301, Mar. 2001.

Alameldeen, Alaa R., et al., "Adaptive Cache Compression for High-Performance Processors", Proceedings of the 31st Annual International Symposium on Computer Architecture, ser. ISCA '04, Washington, DC, USA: IEEE Computer Society, 2004, p. 212-., [Online]. Available: http://dl.acm.org/citation.cfm?id=998680.1006719.

Alameldeen, Alaa R., et al., "Frequent pattern compression: A significance-based compression scheme for L2 caches", Technical Report 1500, Computer Sciences Dept., UW-Madison, Apr. 2004.

Alwani, Manoj, et al., "Fused-Layer CNN Accelerators", 2016, 49th Annual IEEE/ACM International Symposium on Microarchitecture (MICRO), Taipei, Taiwan, 2016, pp. 1-12, doi: 10.1109/MICRO.2016.7783725.

Arelakis, Angelos, et al., "HyComp: A Hybrid Cache Compression Method for Selection of Data-Type-Specific Compression Methods", 2015 48th Annual IEEE/ACM International Symposium on Microarchitecture (MICRO), Waikiki, HI, USA, 2015, pp. 38-49, doi: 10.1145/2830772.2830823.

Arelakis, Angelos, et al., "SC2: A Statistical Compression Cache Scheme", 2014 ACM/IEEE 41st International Symposium on Computer Architecture (ISCA), Minneapolis, MN, USA, 2014, pp. 145-156, doi: 10.1109/ISCA.2014.6853231.

Badrinarayanan, Vijay, et al., "SegNet: A Deep Convolutional Encoder-Decoder Architecture for Image Segmentation", IEEE Transactions on Pattern Analysis and Machine Intelligence, vol. 39, No. 12, pp. 2481-2495, Dec. 1, 2017, doi: 10.1109/TPAMI.2016.2644615.

Brostow, Gabriel J., et al., "Semantic object classes in video: A high-definition ground truth database", Pattern Recognition Letters, vol. 30, Issue 2, 2009, pp. 88-97, ISSN 0167-8655, https://doi.org/10.1016/j.patrec.2008.04.005.

Cavigelli, Lukas, et al., "EBPC: Extended Bit-Plane Compression for Deep Neural Network Inference and Training Accelerators", IEEE Journal on Emerging and Selected Topics in Circuits and Systems, vol. 9, No. 4, pp. 723-734, Dec. 2019, doi: 10.1109/JETCAS.2019.2950093.

Chen, Yunji, et al., "DaDianNao: A Machine-Learning Supercomputer", 2014 47th Annual IEEE/ACM International Symposium on Microarchitecture, Cambridge, UK, 2014, pp. 609-622, doi: 10.1109/MICRO.2014.58.

Choi, Jungwook, et al., "PACT: parameterized clipping activation for quantized neural networks", CoRR, vol. abs/1805.06085, 2018, [Online]. Available: http://arxiv.org/abs/1805.06085.

Dally, Bill, "Power, Programmability, and Granularity: The Challenges of ExaScale Computing", 2011 IEEE International Parallel & Distributed Processing Symposium, Anchorage, AK, USA, 2011, pp. 878-878, doi: 10.1109/IPDPS.2011.420.

Devlin, Jacob, et al., "BERT: pre-training of deep bidirectional transformers for language understanding", CoRR, vol. abs/1810.04805, 2018. [Online]. Available: http://arxiv.org/abs/1810.04805v2.

Edo, Isak, et al., "Boveda: Building an on-chip deep learning memory hierarchy Brick by brick", Proceedings of the 4th MLSys Conference, Apr. 5, 2021, pp. 1-20, [retrieved on Jun. 28, 2021], Retrieved from the Internet: <https://proceedings.mlsys.org/paper/2021/hash/013d407166ec4fa56eb1e1f8cbe183b9-Abstract.html>.

Ekman, Magnus, et al., "A Robust Main-Memory Compression Scheme", Proceedings of the 32nd Annual International Symposium on Computer Architecture, ser. ISCA '05. Washington, DC, USA: IEEE Computer Society, 2005, pp. 74-85. [Online]. Available: https://doi.org/10.1109/ISCA.2005.6.

Hallnor, Erik G., et al., "A Unified Compressed Memory Hierarchy", 11th International Symposium on High- Performance Computer Architecture, Feb. 2005, pp. 201-212.

Han, Song, et al., "Deep Compression: Compressing Deep Neural Networks with Pruning, Trained Quantization and Huffman Coding", arXiv:1510.00149 [cs], Oct. 2015, arXiv: 1510.00149, [Online]. Available: http://arxiv.org/abs/1510.00149.

Han, Song, et al., "EIE: Efficient Inference Engine on Compressed Deep Neural Network", 43rd ACM/IEEE Annual International Symposium on Computer Architecture, ISCA 2016, Seoul, South Korea, Jun. 18-22, 2016, 2016, pp. 243-254, https://doi.org/10.48550/arXiv.1602.01528.

He, Kaiming, et al., "Deep residual learning for image recognition", CoRR, vol. abs/1512.03385, 2015. [Online]. Available: http://arxiv.org/abs/1512.03385.

Horowitz, Mark, "1.1 Computing's energy problem (and what we can do about it)", 2014 IEEE International Solid-State Circuits Conference Digest of Technical Papers (ISSCC), San Francisco, CA, USA, 2014, pp. 10-14, doi: 10.1109/ISSCC.2014.6757323.

Howard, Andrew G., et al., "Mobilenets: Efficient convolutional neural networks for mobile vision applications", CORR, vol. abs/1704.04861, 2017. [Online]. Available: http://arxiv.org/abs/1704.04861.

Zsak, Peter, et al., "NLP Architect by Intel AI Lab (0.3).", (2018), Zenodo, https://doi.org/10.5281/zenodo.1477518.

Jain, Animesh, et al., "Gist: Efficient data encoding for deep neural network training", Proceedings of the 45th Annual International Symposium on Computer Architecture, ser. ISCA '18. Piscataway, NJ, USA: IEEE Press, 2018, pp. 776-789. [Online]. Available: https://doi.org/10.1109/ISCA.2018.00070.

Jouppi, Norm, "Google supercharges machine learning tasks with TPU custom chip", Retrieved from: https://cloudplatform.googleblog.com/2016/05/Googlesupercharges-machine-learning-tasks-with-custom-chip.html, 2016, [Online; accessed Nov. 3, 2016].

Judd, Patrick, et al., "Proteus: Exploiting numerical precision variability in deep neural networks", Proceedings of the 2016 International Conference on Supercomputing, ser. ICS '16. New York, NY, USA: ACM, 2016, pp. 23:1-23:12. [Online]. Available: http://doi.acm.org/10.1145/2925426.2926294.

Krizhevsky, Alex, et al., "Imagenet classification with deep convolutional neural networks", Advances in Neural Information Processing Systems 25: 26th Annual Conference on Neural Information Processing Systems 2012, pp. 1106-1114. Available: http://papers.nips.cc/paper/4824-imagenet-classification-with-deep-convolutional-neural-networks.

Lascorz, Alberto Delmás, et al., "ShapeShifter: Enabling Fine-Grain Data Width Adaptation in Deep Leaning", Proceedings of the 52nd Annual IEEE/ACM International Symposium on Microarchitecture, ser. MICRO '52. New York, NY, USA: ACM, Oct. 12, 2019, , pp. 28-41. [Online]. Available: http://doi.acm.org/10.1145/3352460.3358295.

Lin, Tsung-Yi, et al., "Microsoft COCO: Common Objects in Context", (2014), Computer Vision—ECCV 2014, 740-755. https://doi.org/10.1007/978-3-319-10602-1_48.

Liu, Wei, et al., "SSD: Single Shot MultiBox Detector", Lecture Notes in Computer Science, p. 21-37, 2016. [Online]. Available: http://dx.doi.org/10.1007/978-3-319-46448-0_2.

(56) References Cited

OTHER PUBLICATIONS

Mahmoud, Mostafa, et al., "Diffy: a Deja vu-Free Differential Deep Neural Network Accelerator", Proceedings of the 51st Annual IEEE/ACM International Symposium on Microarchitecture, ser. MICRO-51. Piscataway, NJ, USA: IEEE Press, 2018, pp. 134-147. [Online]. Available: https://doi.org/10.1109/MICRO.2018.00020.

Muralimanohar, Naveen, et al., "Cacti 6.0: A tool to model large caches", Published in International Symposium on Microarchitecture, Chicago, Dec. 2007, HP Laboratories, HPL-2009-85.

Parashar, Angshuman, et al., "SCNN: An accelerator for compressed-sparse convolutional neural networks", Proceedings of the 44th Annual International Symposium on Computer Architecture, ser. ISCA '17. New York, NY, USA: ACM, 2017, pp. 27-40. [Online]. Available: http://doi.acm.org/10.1145/3079856.3080254.

Park, Eunhyeok, et al., "Energy-efficient neural network accelerator based on outlier-aware low-precision computation", 2018 ACM/IEEE 45th Annual International Symposium on Computer Architecture (ISCA), IEEE Computer Society, Los Angeles, CA, USA, 2018, pp. 688-698, doi: 10.1109/ISCA.2018.00063.

Park, Jongsoo, et al., "Faster CNNs with Direct Sparse Convolutions and Guided Pruning", 5th International Conference on Learning Representations (ICLR), 2017.

Pekhimenko, Gennady, et al., "Base-delta-immediate compression: Practical data compression for on-chip caches", Proceedings of the 21st International Conference on Parallel Architectures and Compilation Techniques, ser. PACT '12. New York, NY, USA: ACM, 2012, pp. 377-388.

Pekhimenko, Gennady, et al., "Linearly compressed pages: A low-complexity, low-latency main memory compression framework", Proceedings of the 46th Annual IEEE/ACM International Symposium on Microarchitecture, ser. MICRO-46. New York, NY, USA: ACM, 2013, pp. 172-184. [Online]. Available: http://doi.acm.org/10.1145/2540708.2540724.

Qureshi, Moinuddin K., et al., "The v-way cache: demand-based associativity via global replacement", 32nd International Symposium on Computer Architecture (ISCA'05), Jun. 2005, pp. 544-555.

Rashtchian, Cyrus, et al., "Collecting image annotations using amazon's mechanical turk", Proceedings of NAACL HLT 2010 Workshop on Creating Speech & Language Data with Amazon's Mechanical Turk, ser. CSLDAMT 10. Stroudsburg, PA, USA: Association for Computational Linguistics, 2010, pp. 139-147, http://dl.acm.org/citation.cfm?id=1866696.1866717.

Reddi, Vijay Janapa, et al., "MLPerf Inference Benchmark", 2019, https://arxiv.org/abs/1911.02549v2.

Rhu, Minsoo, et al., "Compressing DMA engine: Leveraging activation sparsity for training deep neural networks", IEEE International Symposium on High Performance Computer Architecture, HPCA 2018, Vienna, Austria, Feb. 24-28, 2018, 2018, pp. 78-91. [Online]. Available: https://doi.org/10.1109/HPCA.2018.00017.

Rosenfeld, Paul, et al., "Dramsim2: A cycle accurate memory system simulator", IEEE Computer Architecture Letters, vol. 10, No. 1, pp. 16-19, Jan.-Jun. 2011, doi: 10.1109/L-CA.2011.4.

Russakovsky, Olga, et al., "ImageNet Large Scale Visual Recognition Challenge", arXiv:1409.0575 [cs], Sep. 2014, arXiv: 1409.0575.

Siu, Kevin, et al., "Memory Requirements for Convolutional Neural Network Hardware Accelerators", 2018 IEEE International Symposium on Workload Characterization (IISWC), Raleigh, NC, USA, 2018, pp. 111-121, doi: 10.1109/ISWC.2018.8573527.

Vivancos, Isak Edo, et al., "Late Breaking Results: Building an On-Chip Deep Learning Memory Hierarchy Brick by Brick", 2020 57th ACM/IEEE Design Automation Conference (DAC), San Francisco, CA, USA, 2020, pp. 1-2, doi: 10.1109/DAC18072.2020.9218728.

Wang, Alex, et al., "Glue: A multi-task benchmark and analysis platform for natural language understanding", CoRR, vol. abs/1804.07461, 2018. [Online]. Available: http://arxiv.org/abs/1804.07461.

Wang, Cheng, "Image captioning with deep bidirectional LSTMs", Proceedings of the 2016 ACM on Multimedia Conference. ACM, 2016, pp. 988-997, arXiv: 1604.00790v3.

Wu, Yonghui, et al., "Google's neural machine translation system: Bridging the gap between human and machine translation", CoRR, vol. abs/1609.08144, 2016. [Online]. Available: http://arxiv.org/abs/1609.08144.

Yang, Tien-Ju, et al., "Designing Energy-Efficient Convolutional Neural Networks using Energy-Aware Pruning", IEEE Conference on Computer Vision and Pattern Recognition (CVPR), 2017, arXiv:1611.05128v4.

SYSTEM AND METHOD FOR MEMORY COMPRESSION FOR DEEP LEARNING NETWORKS

TECHNICAL FIELD

The following relates generally to deep learning networks and more specifically to a system and method for memory compression for deep learning networks.

BACKGROUND

Compression in memory hierarchy has received considerable attention especially in the context of general-purpose systems. However, there are different sets of technical challenges that exist for compression approaches for deep learning workloads. For example, general-purpose compression approaches generally need to support random, fine-grain accesses. Additionally, programs in general-purpose systems tend to exhibit value patterns and a variety of data types that are generally not present in neural networks.

SUMMARY

In one aspect, a method for memory compression for a deep learning network is provided, the method comprising: defining, for a first memory of a deep learning network, a plurality of rows each having a specified number of columns, each column having a column width; receiving an input data stream to be processed by one or more layers of the deep learning network, the input data stream having a plurality of values of a fixed bit width; dividing the input data stream into subsets, the number of values in each subset being equal to the number of columns; compressing the data stream by sequentially compacting each subset, comprising: identifying, for values within the subset, a compressed bit width necessary to accommodate the value with the highest magnitude; storing the bit width in a bit width register associated with the row; storing, in the respective column of the memory beginning from a first unoccupied bit, a least significant bits of each value within the subset, the number of bits equal to the bit width, wherein if storing the number of bits requires more bits than those currently left unused in the respective column of the respective row, the remaining bits are written into the respective column of a subsequent row; and wherein the compressed data stream can be decompressed to reproduce the input data stream by: identifying a location of a first unread bit of each column of the compressed data stream; sequentially outputting the reproduced input data by: obtaining the bit width of each subset from the respective bit width register; retrieving from each column of the first memory, beginning at the first unread bit of the column, the number of bits corresponding to the bit width and outputting the retrieved bits to the least significant bits of an output; updating the location of the first unread bit of each column to correspond to the bit location subsequent to the retrieved bits; zero or sign extending remaining most significant bits of the output to obtain the reproduced input data value.

In a particular case of the method, the location of a block of compressed values can be located by one or more pointers.

In a particular case of the method, the block is a filter map data block or an input or output activations data block.

In a particular case of the method, the location is for the first compressed value of the block.

In a particular case of the method, the one or more pointers comprise a first set of pointers to data for input or output activations maps and a second set of pointers to data for filter maps.

In a particular case of the method, receiving an input data stream comprises sequentially receiving portions of the block beginning at the location of the one or more pointers, compressing the portion of the block, and updating an offset pointer for recalling the next portion to be received.

In a particular case of the method, receiving an input data stream comprises sequentially receiving portions of the block, wherein a location for each portion is identified by one of the pointers.

In a particular case of the method, a portion of the compressed data values are forced to be stored starting at the least significant bit of a column by padding unoccupied most significant bits of a preceding data value.

In a particular case of the method, the bit width register for some rows stores a binary representation of the length of the bit width.

In a particular case of the method, the bit width register for other rows stores a single bit designating whether the bit width of the corresponding row is the same or different than the previous row.

In a particular case of the method, the method is used to store floating point values, the floating point values comprising a sign portion, and exponent portion and a mantissa portion, the input data stream consisting of the exponent portions of the floating point values, and wherein compressing further comprises, for each floating point value, storing the sign portion and mantissa portion adjacent to the compressed exponent portion.

In a particular case of the method, during decompression a pointer is established for the location of a particular one of the blocks that is known to be needed at a future time.

In a particular case of the method, the method further comprises tracking a next unoccupied location in each column of the first memory while compressing and storing the values.

In a particular case of the method, the method further comprises initializing a first storage location of the first memory as being unoccupied prior to compressing the data stream.

In a particular case of the method, the plurality of values are of a fixed bit width less than or equal to the column width.

In a particular case of the method, the reproduced data stream is output directly to an arithmetic/logic unit.

In a particular case of the method, the reproduced data stream is output to a second memory having a plurality of rows each having a plurality of columns corresponding to the first memory.

In a particular case of the method, compressing further comprises prior to identifying the compressed bit width, evaluating a function on the values of the input data stream to reduce the compressed bit width and reversing the function for decompression.

In another aspect, a method for memory decompression for a deep learning network is provided, the method comprising: obtaining a compressed data stream representing an input data stream, the compressed data stream prepared by: defining, for a first memory of a deep learning network, a plurality of rows each having a specified number of columns, each column having a column width; receiving the input data stream to be processed by one or more layers of the deep learning network, the input data stream having a plurality of values of a fixed bit width; dividing the input data stream into subsets, the number of values in each subset being equal to the number of columns; compressing the data stream by sequentially compacting each subset, comprising: identifying, for values within the subset, a compressed bit width necessary to accommodate the value with the highest magnitude; storing the bit width in a bit width register associated with the row; storing, in the respective column of the memory beginning from a first unoccupied bit, a least significant bits of each value within the subset, the number of bits equal to the bit width, wherein if storing the number of bits requires more bits than those currently left unused in the respective column of the respective row, the remaining bits are written into the respective column of a subsequent row; and decompressing the compressed data stream to reproduce the input data stream by: identifying a first unread bit of each column of the compressed data stream;

sequentially outputting the reproduced input data by: obtaining the bit width of each subset from the respective bit width register; retrieving from each column of the first memory, beginning at the first unread bit of the column, the number of bits corresponding to the bit width and outputting the retrieved bits to the least significant bits of an output; updating the first unread bit of each column to correspond to the bit location subsequent to the retrieved bits; zero or sign extending remaining most significant bits of the output to obtain the reproduced input data value.

In yet another aspect, a system for memory compression for a deep learning network is provided, the system comprising: a first memory having a plurality of rows each having a specified number of columns, each column having a column width; an input module for: receiving an input data stream to be processed by one or more layers of the deep learning network, the input data stream having a plurality of values of a fixed bit width; and dividing the input data stream into subsets, the number of values in each subset being equal to the number of columns; a width detector module having a plurality of bit width registers each associated with a row, the width detector module identifying, for values within the subset, a compressed bit width necessary to accommodate the value with the highest magnitude and storing the bit width in the bit width register associated with the row; a compacting module for storing, in the respective column of the memory beginning from a first unoccupied bit, a least significant bits of each value within the subset, the number of bits equal to the bit width, wherein if storing the number of bits requires more bits than those currently left unused in the respective column of the respective row, the remaining bits are written into the respective column of a subsequent row; and a decompression module for decompressing the compressed data stream to reproduce the input data stream by: identifying a first unread bit of each column of the compressed data stream; sequentially outputting the reproduced input data by: obtaining the bit width of each subset from the respective bit width register; retrieving from each column of the first memory, beginning at the first unread bit of the column, the number of bits corresponding to the bit width and outputting the retrieved bits to the least significant bits of an output; updating the first unread bit of each column to correspond to the bit location subsequent to the retrieved bits; zero or sign extending remaining most significant bits of the output to obtain the reproduced input data value.

In a particular case of the system, the system further comprises a pointer module having one or more pointers for tracking the location of a block of compressed values.

In a particular case of the system, the block is a filter map data block or an input or output activations data block.

In a particular case of the system, the location is for the first compressed value of the block.

In a particular case of the system, the one or more pointers comprise a first set of pointers to data for input or output activations maps and a second set of pointers to data for filter maps.

In a particular case of the system, the system further comprises an offset pointer, wherein receiving an input data stream comprises sequentially receiving portions of the block beginning at the location of the one or more pointers, compressing the portion of the block, and updating the offset pointer for recalling the next portion to be received.

In a particular case of the system, receiving an input data stream comprises sequentially receiving portions of the block, wherein a location for each portion is identified by one of the pointers.

In a particular case of the system, a portion of the compressed data values are forced to be stored starting at the least significant bit of a column by padding unoccupied most significant bits of a preceding data value.

In a particular case of the system, the bit width register for some rows stores a binary representation of the length of the bit width.

In a particular case of the system, the bit width register for other rows stores a single bit designating whether the bit width of the corresponding row is the same or different than the previous row.

In a particular case of the system, the system is for storing floating point values, the floating point values comprising a sign portion, and exponent portion and a mantissa portion, the input data stream consisting of the exponent portions of the floating point values, and wherein compressing further comprises, for each floating point value, storing the sign portion and mantissa portion adjacent to the compressed exponent portion.

In a particular case of the system, during decompression a pointer is established for the location of a particular one of the blocks that is known to be needed at a future time.

In a particular case of the system, the compacting module is configured to track a next unoccupied location in each column of the first memory while compressing and storing the values.

In a particular case of the system, the compacting module is configured to initialize a first storage location of the first memory as being unoccupied prior to compressing the data stream.

In a particular case of the system, the plurality of values are of a fixed bit width less than or equal to the column width.

In a particular case of the system, the reproduced data stream is output directly to an arithmetic/logic unit.

In a particular case of the system, the reproduced data stream is output to a second memory having a plurality of rows each having a plurality of columns corresponding to the first memory.

In a particular case of the system, compressing further comprises prior to identifying the compressed bit width, evaluating a function on the values of the input data stream to reduce the compressed bit width and reversing the function for decompression.

These and other aspects are contemplated and described herein. It will be appreciated that the foregoing summary sets out representative aspects of embodiments to assist skilled readers in understanding the following detailed description.

DESCRIPTION OF THE DRAWINGS

A greater understanding of the embodiments will be had with reference to the Figures, in which.

DETAILED DESCRIPTION

Figure 1:
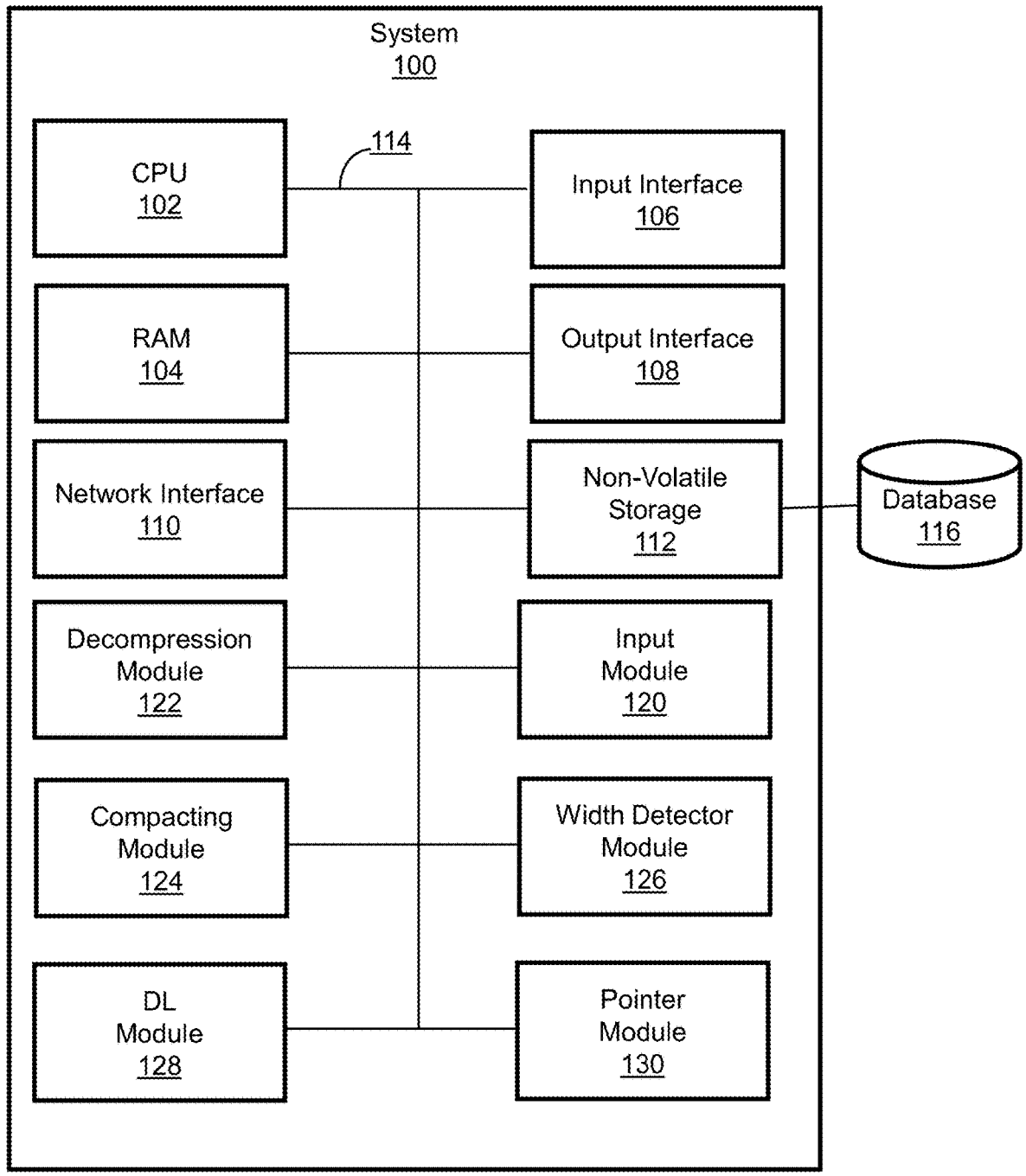
FIG. 1 is a schematic diagram of a system for memory compression for deep learning networks, in accordance with an embodiment.

Embodiments will now be described with reference to the figures. For simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Any application or module herein described may be implemented using computer readable/executable instructions that may be stored or otherwise held by such computer readable media.

Compression in memory hierarchy is particularly appealing for deep learning workloads and accelerators where memory accesses are responsible for a large fraction of overall energy consumption. Compression can provide a technical advantage to the operation of computers and, more particularly in the present case, deep learning networks. First, for example, compression can increase the hierarchy's effective capacity and bandwidth, boost energy efficiency and reduce overall access latency. Specifically, compressing data at any level of the hierarchy can boost its effective capacity as each value requires fewer physical bits when encoded. Second, it reduces accesses to higher levels of the hierarchy which require much more energy and time per access, thus improving effective latency and energy efficiency. Third, compression reduces the number of bits that are read or written per value, boosting effective bandwidth and energy efficiency. Further, it complements dataflow and blocking for reuse, the frontline techniques for boosting energy efficiency in the memory hierarchy. These benefits have motivated work on off-chip memory compression for neural networks. Embodiments of the present disclosure advantageously provide compression in the on-chip memory hierarchy.

Compression in the memory hierarchy has received considerable attention in the context of general-purpose computing systems. Compression for general-purpose computing systems has to support arbitrary access patterns and generally relies on value patterns that are common in computer programs (e.g., pointer or repeated values). However, the inventors have determined that deep learning workloads exhibit specific behaviours which present additional opportunities and technical challenges. For example, the access patterns for deep learning workloads are typically regular and consist of long sequential accesses. This mitigates the benefit of supporting random access patterns. Additionally, neural network values generally consist of feature and filter maps that generally do not exhibit the properties of typical program variables. Further, neural network hardware tends to be data-parallel, necessitating wide accesses.

Supporting random, fine-grain accesses requires the ability to locate the compressed values in memory both quickly and at a fine-grain granularity. This forces general-purpose compression methods to use small blocks, which generally severely inhibits the effective capacity. As a result, many compression approaches reduce the amount of data transferred, but not the size of the containers they use in storage. For example, they encode data within a cache line so that it needs to read or write fewer bits. However, the full cache line is still reserved. Alternatively, methods use a level of indirection to identify where data is currently located in memory, requiring careful balancing between flexible placement and metadata overhead.

Typical programs tend to exhibit full or partial value redundancy. For example, due to the use of memory pointers, several values tend to share prefixes (e.g., pointers to the stack or to heap allocated structures). Programs often use aggregate data structures which tend to exhibit partially repeated value patterns (e.g., flag fields). Approaches to compression generally need to handle a variety of datatypes, including integers and floating point numbers, or characters from a variety of character sets (e.g., UTF-16). Further, programs manage datatypes of various power-of-two datawidths, such as 8b, 16b, 32b or more. Finally, programmers often use the "default" integer or floating point datatypes (e.g., 32b or 64b). Compression techniques can capitalise on these characteristics to reduce data footprint.

In contrast, inventors have determined that deep learning workloads tend to exhibit long sequential accesses even when blocking for reuse is used. This can mitigate the need to support random accesses to fine-grain blocks. Further, values in deep learning workloads do not generally exhibit the repeated patterns of general computer programs. The bulk of their memory footprint is for storing large arrays of short datatypes, such as 8b or 16b. Generally, given the large volume of data and computations, deep learning models choose their datatypes carefully to be as small as possible. Quantisation techniques to even smaller datatypes, such as 4b, can also be used. In some cases, there are models for which 16b is still necessary; for example, for certain segmentation models where even small drops in accuracy translate in highly visible artefacts. Further, while programs tend to perform narrow memory requests, neural networks generally exhibit data parallelism and prefer wide references.

Embodiments of the present disclosure advantageously provide an on-chip compression scheme where data remains encoded as much as possible. In some cases, data can be decompressed before the processing elements of the deep learning approach, which favours simple to implement schemes, especially for decoding. Many compression techniques for general purpose systems generally operate between the last-level cache and other caches of the on-chip hierarchy where latency is not as critical and thus can tolerate additional complexity. Advantageously, embodiments of the present disclosure provide a lossless on-chip compression scheme which, for example: (1) can support the relatively long sequential accesses generally needed by neural networks, (2) can support multiple wide accesses to maintain high utilisation of processing units, (3) allows decoding to happen just before the processing units, thus keeping data compressed for as long as possible, and (4) takes advantage of value behaviour that is typical of neural networks.

Embodiments of the present disclosure (in some cases, informally referred to as 'Boveda') provide an on-chip memory hierarchy compression scheme that advantageously exploits typical distribution of values in neural networks that operate on fixed-point values; particularly, in each layer, very few values are of a high magnitude as most tend to be close to zero. Accordingly, rather than storing all values using the same number of bits, embodiments of the present disclosure adjust datawidth to value content so that they use only as many bits as necessary. Allowing each value to select its datawidth independently would result in unacceptable metadata overhead (a width field per value). Instead, embodiments of the present disclosure group values and select a common datawidth, which is sufficiently wide to accommodate the value with the highest magnitude in the group. For example, for a group of eight 8b (8-bit) values where the highest magnitude value is 0x12, a container of 8×5b can be used, whereas for another group, where the maximum magnitude value is 0x0a, 8×4b can be used. In either case, a metadata field of 3b will specify the number of bits used per value (5 and 4 respectively). Since variable data width containers can be used, decoding the values and properly aligning them to feed to the processing units would normally require wide crossbars. For example, a processing element operating on 8 values of 8b each would require a crossbar of 64b to 64b, as well as additional logic to handle values that spread over two memory rows. Embodiments of the present disclosure exploit the regular access pattern of neural networks to organize the compressed data in memory such that it instead requires multiple, yet much smaller "crossbars".

Advantageously, embodiments of the present disclosure can boost the effective on-chip capacity without requiring any modifications to the neural network model. This can yield energy and/or performance benefits depending on whether the model is off-chip or compute bound. An architect can deploy the present embodiments during design time to reduce the amount of on-chip memory and thus the cost needed to meet a desired performance target. To a neural network developer, the present embodiments provide an approach that needs to go off-chip less often and that rewards quantisation without requiring it for all models. In the present disclosure, to demonstrate that the present approaches are not specific to a particular accelerator architecture, example experiments are applied on an accelerator for dense models and for sparse convolutional neural networks (SCNN), an accelerator targeting pruned models. For SCNN, the example experiments illustrate that the present embodiments can operate on top of SCNN's zero compression. For the purposes of illustration, the example experiments use computer vision tasks, particularly image classification, to illustrate the effectiveness of the present embodiments. While this represents a fraction of the vast array of domains to which deep learning can be applied, it is of high importance and value due to the variety and volume of applications where image processing systems are employed. The example experiments determined that the present embodiments:

Reduced total model footprint to 49%. For models that are quantised using specialised methods, it achieved nearly ideal compression rates. In the case of one method, it nearly doubled the compression rate compared to what specialised hardware would have delivered due to taking advantage of value content.

Reduced the volume of bits accessed on-chip to 50%.

Improved performance by 1.4× and energy by 28% for a dense accelerator with a 96 KB global buffer.

Reduced overall model footprint to 66% over SCNN's zero compression.

Reduced energy when merged with SCNN by 26% compared to an average of 20% for the configurations studied.

Figure 2:
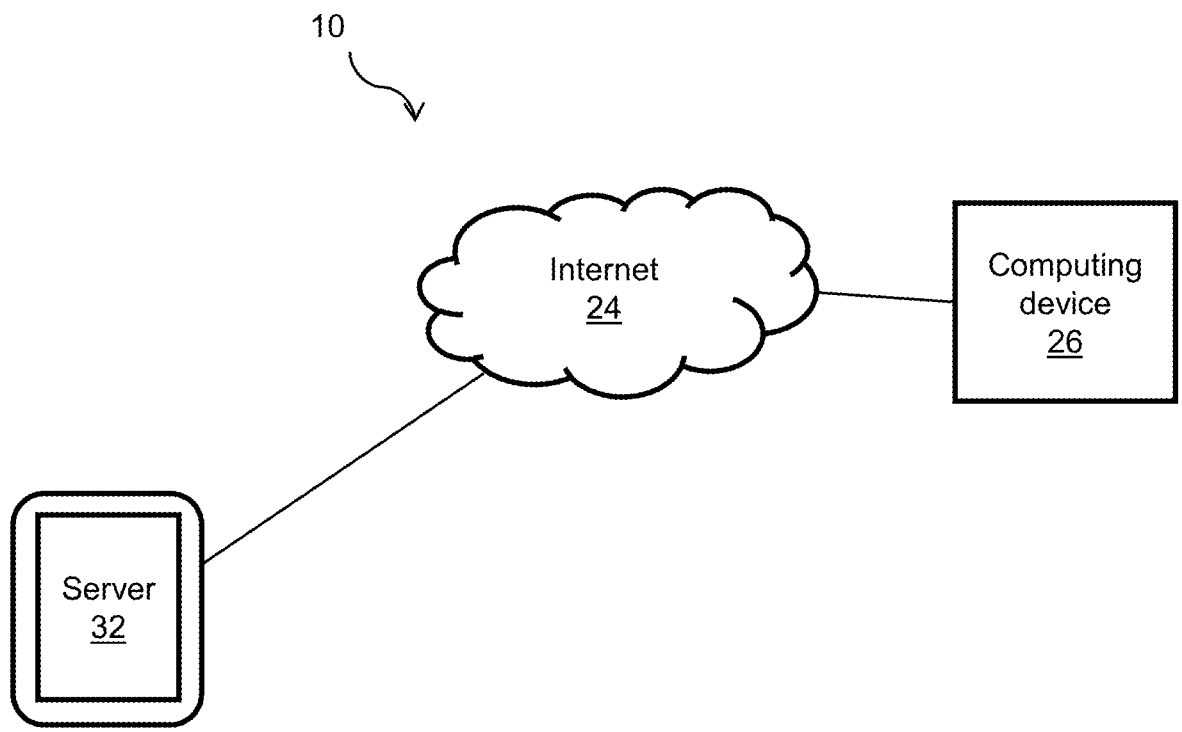
FIG. 2 is a schematic diagram showing the system of FIG. 1 and an exemplary operating environment.

Referring now to FIG. 1 and FIG. 2, a system 100 for memory compression for deep learning networks, in accordance with an embodiment, is shown. In this embodiment, the system 100 is run on a computing device 26 and accesses content located on a server 32 over a network 24, such as the internet. In further embodiments, the system 100 can be run only on the device 26 or only on the server 32, or run and/or distributed on any other computing device; for example, a desktop computer, a laptop computer, a smartphone, a tablet computer, a server, a smartwatch, distributed or cloud computing device(s), or the like. In some embodiments, the components of the system 100 are stored by and executed on a single computer system. In other embodiments, the components of the system 100 are distributed among two or more computer systems that may be locally or remotely distributed.

FIG. 1 shows various physical and logical components of an embodiment of the system 100. As shown, the system 100 has a number of physical and logical components, including a central processing unit ("CPU") 102 (comprising one or more processors), random access memory ("RAM") 104, an input interface 106, an output interface 108, a network interface 110, non-volatile storage 112, and a local bus 114 enabling CPU 102 to communicate with the other components. CPU 102 executes an operating system, and various modules, as described below in greater detail. RAM 104 provides relatively responsive volatile storage to CPU 102. The input interface 106 enables an administrator or user to provide input via an input device, for example a keyboard and mouse. The output interface 108 outputs information to output devices, for example, a display and/or speakers. The network interface 110 permits communication with other systems, such as other computing devices and servers remotely located from the system 100, such as for a typical cloud-based access model. Non-volatile storage 112 stores the operating system and programs, including computer-executable instructions for implementing the operating system and modules, as well as any data used by these services. Additional stored data, as described below, can be stored in a database 116. During operation of the system 100, the operating system, the modules, and the related data may be retrieved from the non-volatile storage 112 and placed in RAM 104 to facilitate execution.

In an embodiment, the system 100 includes number of functional modules, such as an input module 120, a decompression module 122, a width detector module 126, a compacting module 124, a deep learning (DL) module 128, and a pointer module 130. In further embodiments, the functions of the modules can be combined or run on other modules. In some cases, the functions of the modules can be run at least partially on dedicated hardware, while in other cases, at least some of the functions of the modules are executed on the CPU 102.

Figure 4A:
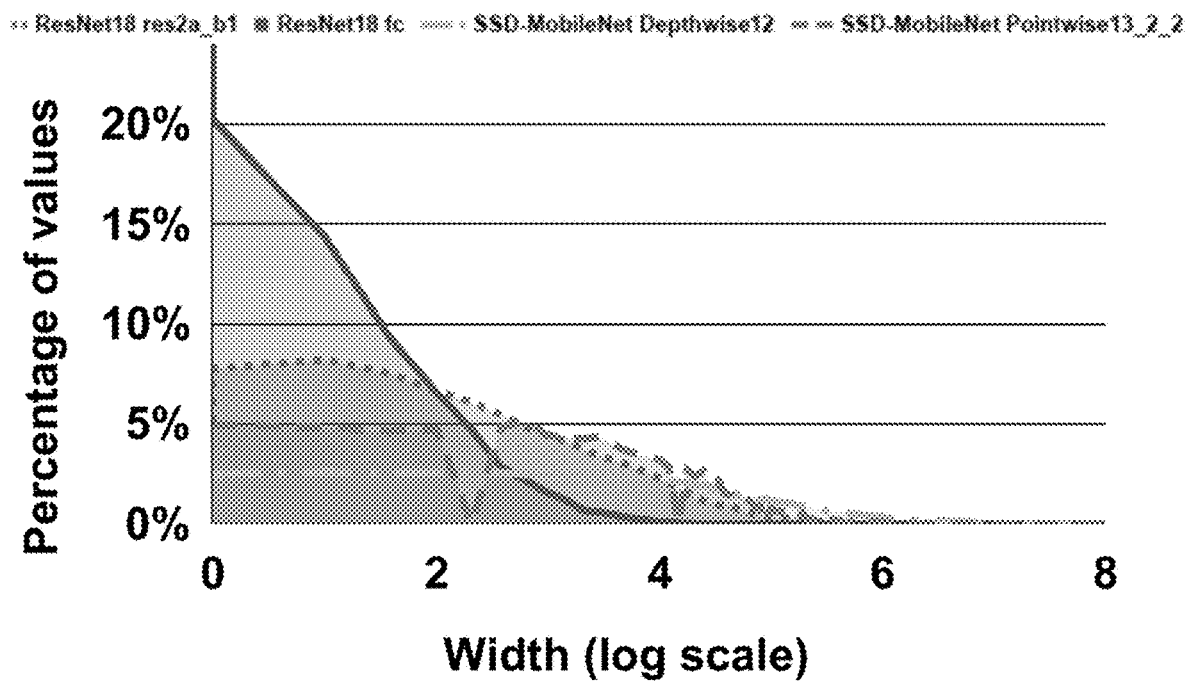
FIG. 4A shows an example of imap value distribution over a batch of 64 randomly selected inputs.
Figure 4B:
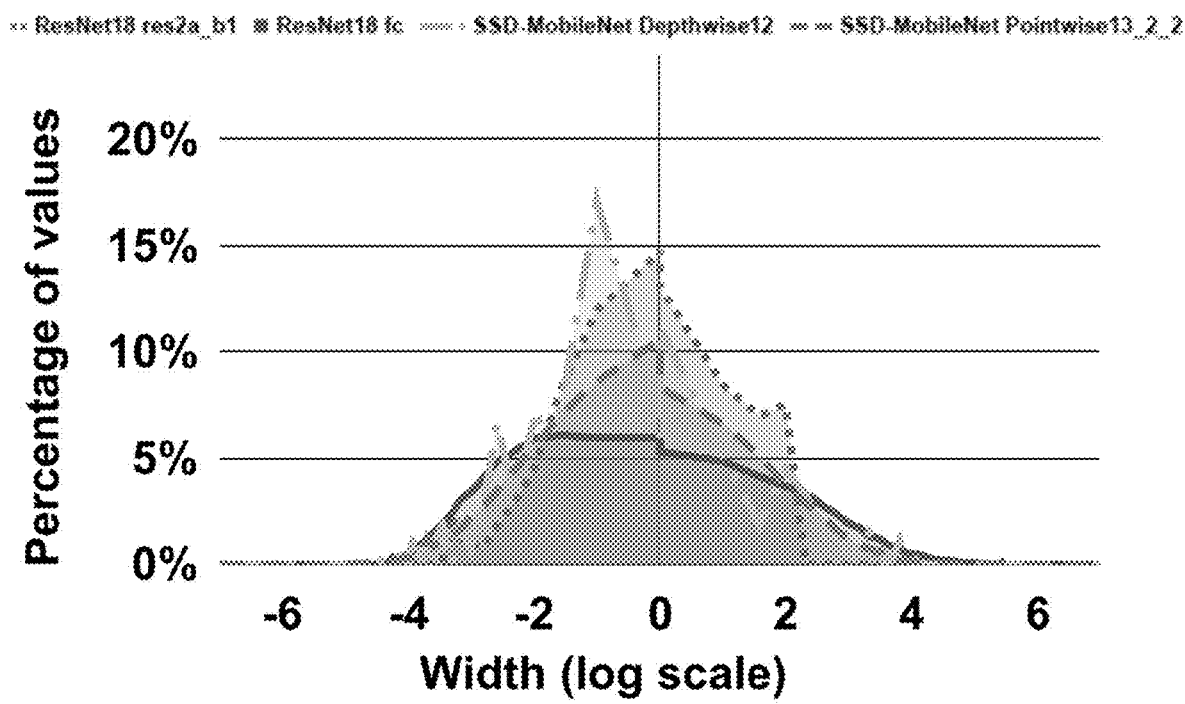
FIG. 4B is shows example fmap value distribution that is input independent.
Figure 5A:
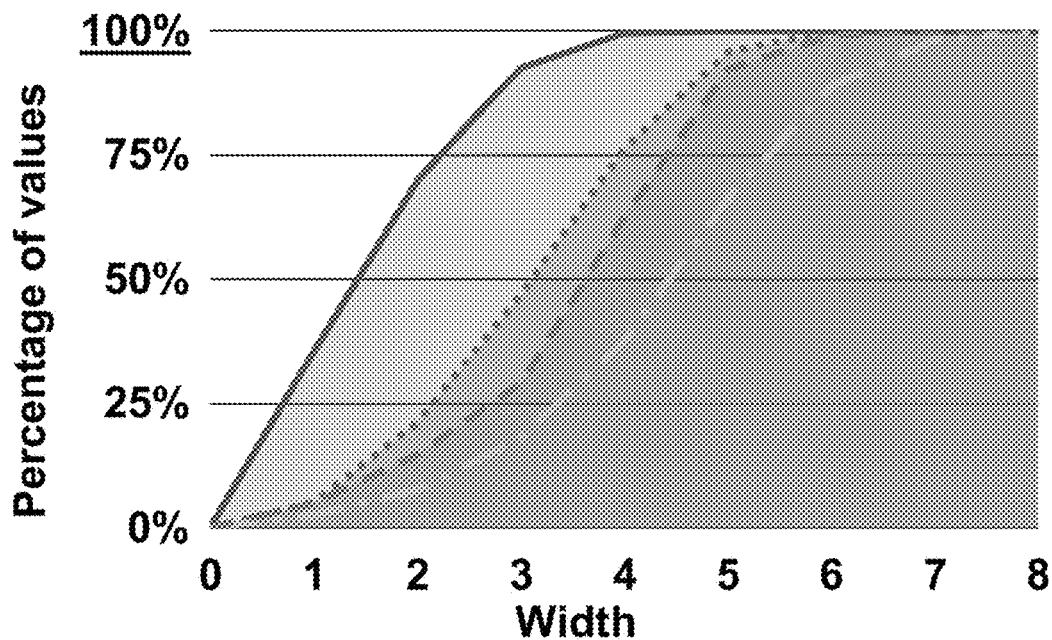
FIG. 5A shows imap cumulative distribution over the batch of 64 randomly selected inputs.
Figure 5B:
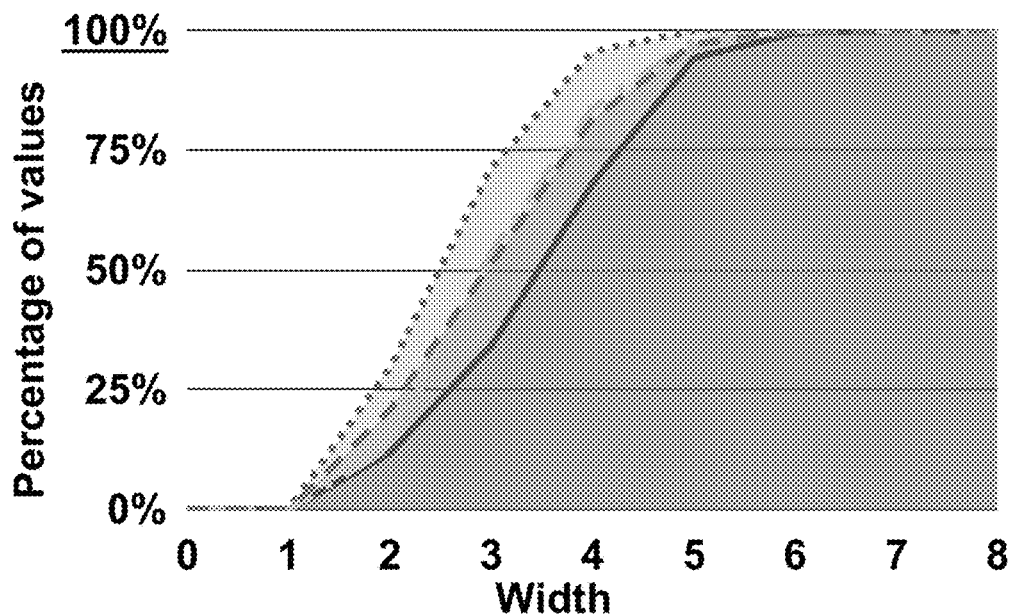
FIG. 5B shows example fmap cumulative distribution that is input independent.

Distributions of input feature maps (imap) and filter maps (fmap) values are generally heavily skewed towards low magnitudes. It is this behaviour that can be exploited by the system 100 to construct a low-cost, energy efficient compression technique. To capitalise on these distributions, the system 100 can adapt the number of bits (datawidth) used per element to be just long enough to fit its current value. Since fmaps are typically static, the datawidth used will be different across fmap elements but will be input independent. On the other hand, imap values are input dependent, therefore the datawidth used by the system 100 can adapt to the value each element takes. In contrast, other memory hierarchies store all imap or fmap elements using a datawidth, which is sufficiently long to accommodate any value possible. However, as the present inventors have empirically determined, this proves excessive for most elements. For the purposes of illustration, two models are highlighted: ResNet18 (image classification), and SSD MobileNet (object-detection), both quantised to 8b. FIGS. 4A, 4B, 5A, and 5B show regular and cumulative distributions of imap and fmap values for some representative convolutional and fully-connected layers. FIGS. 4A and 5A show imap value distribution and cumulative distribution, respectively, over a batch of 64 randomly selected inputs, and FIGS. 4B and 5B show fmap value distribution and cumulative distribution that are input independent.

FIGS. 4A and 5A show that in ResNet18's res2a_branch1, most of the imap values can be represented with 5b, which under ideal conditions translates into a 37.5% reduction in footprint over the 8b used. Just 4b, a 50% reduction over 8b, are sufficient for virtually all imap values in its fully-connected layer fc. SSD Mobilenet exhibits similar behaviour. In its 2D convolution layer depthwise12 90% of the values need 6b or fewer, which is also enough to represent virtually all imap values in its object detection SSD module layer pointwise13_2_2. FIGS. 4B and 5B show similar trends for the fmaps. ResNet18's res2 branch1 only 5b are sufficient for most of the fmap values whereas 6b are sufficient for virtually all values in its fc layer. However, in fc 95% of the fmap values need at most 5b. SSD-MobileNet's fmaps are similar. Virtually all values fit in 6b, 90% fit in 5b and more than 80% in 4b.

In some cases, the system 100 can be applied over an SCNN accelerator, which is an accelerator for convolutional layers of pruned CNN models. For purposes of illustration, the system 100 is described as applied to convolutional layers of an SCNN; however, it is appreciated that it can be applied to other data-parallel deep learning accelerators and other types of layers, such as fully-connected layers.

Figure 6:
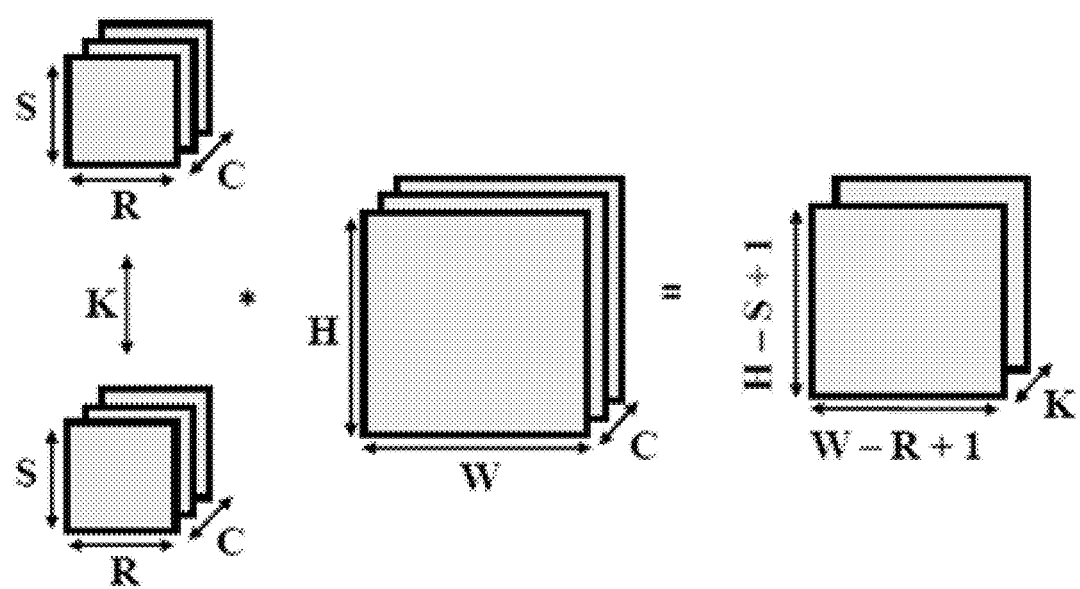
FIG. 6 shows a diagram of an example of a convolutional layer for the purposes of illustration.

FIG. 6 shows a diagram of an example of a convolutional layer for the purposes of illustration. The inputs are K fmaps of dimension S×R×C (height, width, channel), an H×W×C imap, where typically H>>S and W>>R, and a stride s. The fmaps are statically known values (weights), whereas the imaps are runtime calculated values (activations). The output is an $$\left(\left\lceil\frac{H-S}{s}\right\rceil+1\right)\times\left(\left\lceil\frac{W-R}{s}\right\rceil+1\right)\times K$$

omap (activations). This example assumes s=1. Each omap value is determined as a three-dimensional (3D) convolution of an fmap with an equally sized window of the imap. Each fmap produces the omap values for one channel by sliding the window over the imap using the stride s along the H and W dimensions. The 3D convolution involves a pair-wise multiplication of an fmap element with its corresponding imap element, followed by the accumulation of all these products into the omap value. Each 3D convolution is equivalently the sum of C two-dimensional (2D) convolutions on each input channel.

Figure 7:
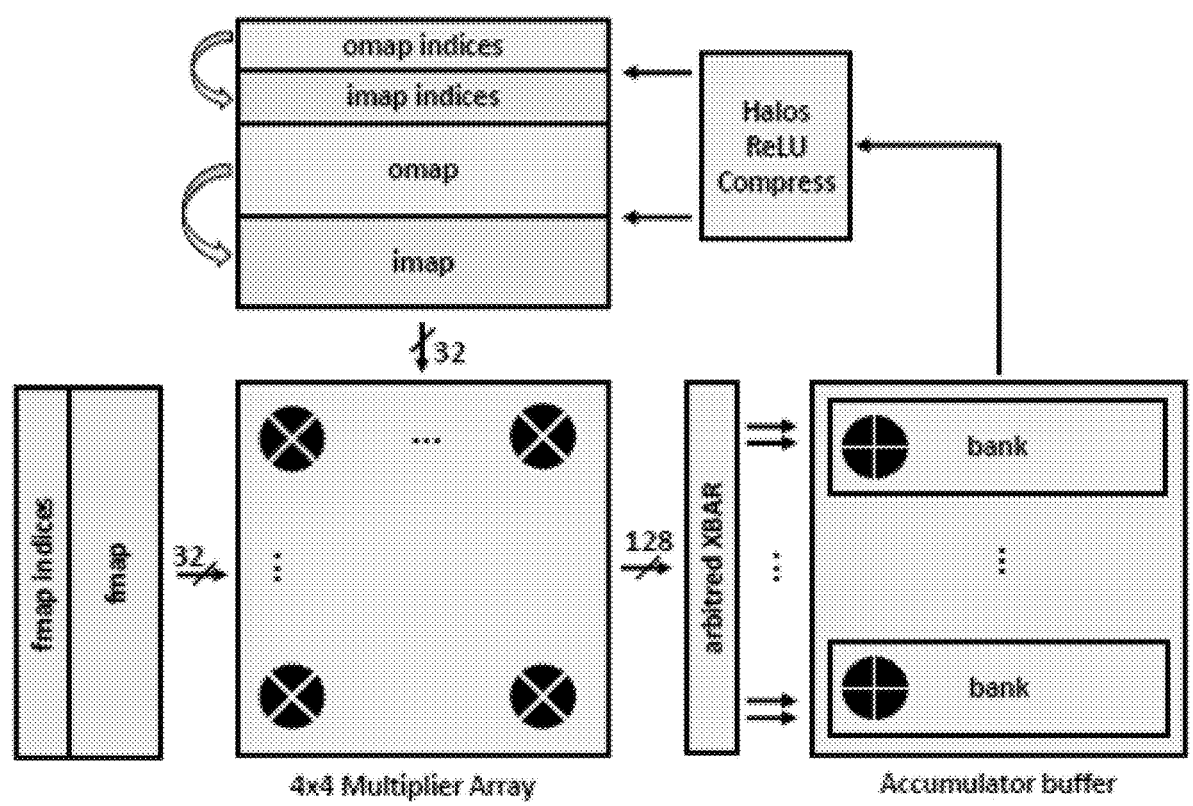
FIG. 7 shows a diagram of an example of organization of a sparse convolutional neural networks (SCNN) tile.

SCNN stores values in an N.Samples-Channel-Height-Width (NCHW) order and the omap is determined by a spatial input stationary convolution. This allows SCNN to process imaps and fmaps one channel at time, which in turn allows it to exploit sparsity. FIG. 7 shows a diagram of an example of organization of an SCNN tile. SCNN uses a grid of such tiles to scale up performance. For the purposes of illustration and ease of understanding, it can be assumed that there is only one tile. However, it is understood that the present embodiments of the system 100 can be used for multiple tiles.

The tile has three buffers respectively holding imaps (and omaps), fmaps, and accumulators. The accumulators accumulate omap values. SCNN uses a spatial dataflow where it performs all 2D convolutions for all windows of a single channel of the imap at a time. SCNN builds on the observation that in convolutional layers the product of any fmap value with any imap value from the same channel contributes to some omap value. Accordingly, at maximum throughput, the tile processes 4 imap and 4 fmap values all from the same channel and calculates the products for all 16 possible (imap, fmap) pairs. It then directs, via a crossbar, all these products into their corresponding accumulator. The accumulator buffer is organized into 32 banks in order to reduce conflicts which occur when multiple products map onto accumulators in the same bank. To take advantage of sparsity, the imap and the fmap omit zero values storing non-zero values as ((value), (skip)) pairs where (skip) is the number of zero values omitted after each. By using these (skip) fields, SCNN deduces the original position of each value and maps the products to their respective accumulators. For the purposes of illustration and ease of understanding, the skip fields are omitted and 8b values are assumed. As described herein, 16b (original) and 8b SCNN configurations are considered.

Figure 8A:
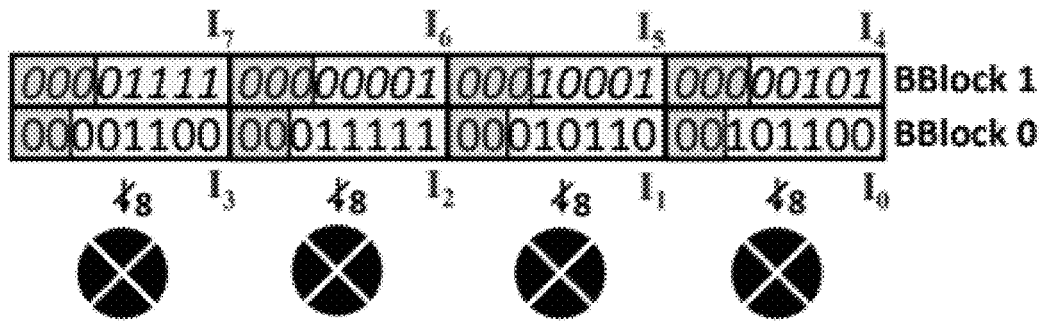
FIG. 8A illustrates an example of a fixed datawidth buffer.

Typically, SCNN would process two consecutive blocks as follows. Consider $(I_0, \ldots, I_3)$ and $(I_4, \ldots, I_7)$ of 4 imap values each; referred to as BBlock 0 and BBlock 1. Note that the values within each block are conceptually ordered: $I_0$ is the first value within BBlock0 whereas $I_7$ is the first value within BBlock1. Initially, it can be assumed that these are unsigned numbers. FIG. 8A illustrates an example of a fixed datawidth buffer. In this example, SCNN's imap buffer uses a container of 8b per value and supports 4-value-wide reads (32b). With this organization, the values as read from the imap buffer align directly with the multiplier inputs. However, all values in BBlock 0 have a prefix of at least 2 zero bits, and those in BBlock 1 have 3 bits. In contrast, one of the goals of the system 100 is to avoid storing these prefix bits.

Figure 8B:
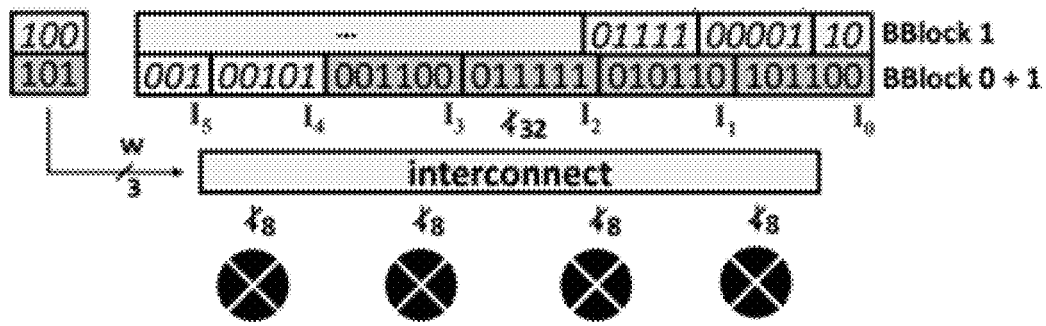
FIG. 8B illustrates an example of a naïve approach to supporting variable datawidths.

FIG. 8B illustrates an example of a naïve approach to supporting variable datawidths. This approach is a straightforward, yet generally undesirable, way to store the compressed values. For each BBlock of four values, a width field specifies the number of bits per value; in this example, 5 for BBlock 0 and 6 for BBlock 1 (encoded as 4 (100) and 5 (101)). A single width field per BBlock amortizes its overhead over multiple values. In this example, the values are stored sequentially across BBlock0 and, once BBlock0 is fully occupied the values are stored sequentially across BBlock1.

Unfortunately, decompression comes at a hefty price because the values are no longer aligned with the multiplier inputs and may even spread over two rows. For each multiplier column, width bits (varies per BBlock) need to be extracted and routed to a multiplier input after expanding to 8b. This routing requires a 32b-to-8b crossbar-like interconnect. Since there are four multiplier columns, four such crossbars are needed, which represents a significant cost in area and energy. If the multiplier grid had 8×8 multipliers 64b-to-8b crossbars would have been needed.

The system 100 can perform approaches that are advantageously of much lower complexity and cost. In an embodiment, the values can be treated as belonging to one of four groupings called hileras, which correspond to multiplier columns; the first value in each BBlock belongs to hilera 0, the second value to hilera 1, and so on. The approach of FIG. 8B breaks this mapping and allows compressed values to flow freely across hileras.

Figure 8C:
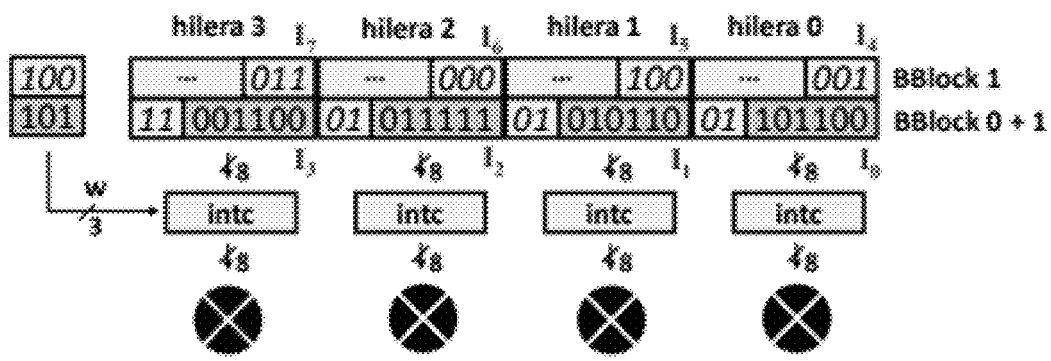
FIG. 8C illustrates an example of supporting variable datawidths in accordance with the system of FIG. 1.

The system 100 instead restricts values to stay within their original hilera; as exemplified in the diagram of FIG. 8C. This example shows $I_0$ and $I_4$ are packed together into the hilera mapped onto the buffer's first 8 bits, whereas $I_3$ and $I_7$ are packed into the hilera mapped onto the last 8 bits. To draw an analogy, values are used as bovedillas (bricks) to fill its hileras. The "crossbars" needed in this example are now 8b-to-8b, their size depends only on the maximum datawidth and is independent of the number of values read per cycle; an 8×8 multiplier grid would require eight 8b-to-8b crossbars instead of eight 64b-to-8b ones.

Figure 9B:
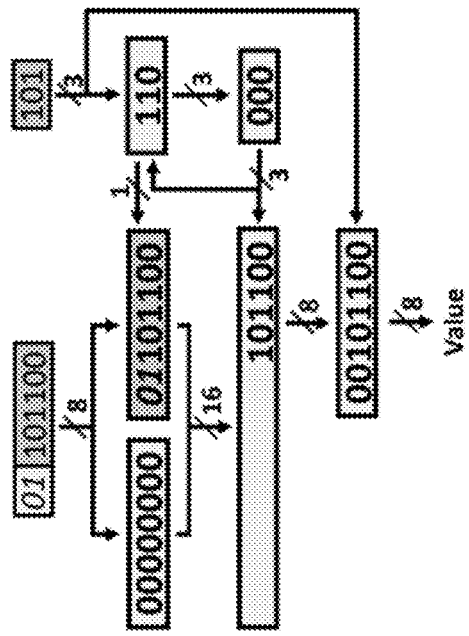
FIG. 9B is an example of a second cycle (iteration) of the decompression module of FIG. 9A.
Figure 9A:
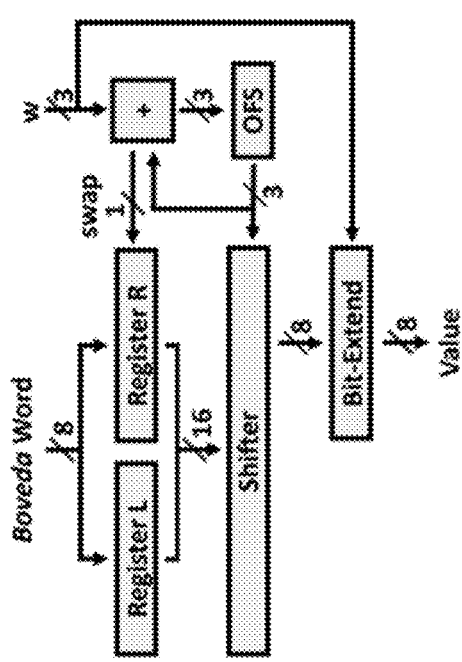
FIG. 9A shows a diagram of an example of a decompression module in accordance with the system of FIG. 1.

FIG. 9A shows a diagram of an example of the decompression module 122. The decompression module 122 decompresses a single value per cycle, properly handling those values that spread over two rows. While the illustrated decompression module 122 depicts one decompression block, keeping with the example of FIG. 8C, four decompression blocks of the decompression module 122 would operate in parallel to decompress four imap values per cycle. Reads from the imap buffer remain 32b wide. From each read, each block receives the corresponding 8b for its hilera. Within each block, two 8b registers L and register R hold compressed data. Every time a new set of 8b is read in, it is written into register L while simultaneously the current contents of register L are "copied" into register R. In some cases, rather than physically copying register L into register R, a bit pointer can be used to "swap" the two. In steady state, register L and register R will contain two consecutive rows from one hilera from the imap buffer, and thus, all bits necessary to decompress an 8b value regardless of width. A 16b-to-8b shifter extracts the current value from the value formed by concatenating the output of register L and register R. In this 16b example, the shifter only needs to support shifts up to 7 positions left and as specified by a 3b "offset" register ("OFS"). A 3b register ("W") holds the data width of the current BBlock. OFS and W, and the associated control logic, can be shared among all four decompression blocks. Initially, in this example, OFS=0 and W=7, both corresponding to the maximum datawidth. A "Bit-Extend" block passes the W LSbs from the output of the shifter and sign-extends them to 8b. The compression block can operate as a two-stage pipeline where the first stage loads values into register L and register R, while the second stage extracts the next decompressed 8b value from the contents of register L and register R. In this example, the decompression block requires three cycles in total (an extra cycle is needed for the initiation interval) for the first multiplier column to decompress $I_0$ and $I_4$. In steady state, the decompression block can output a value per cycle.

Figure 9C:
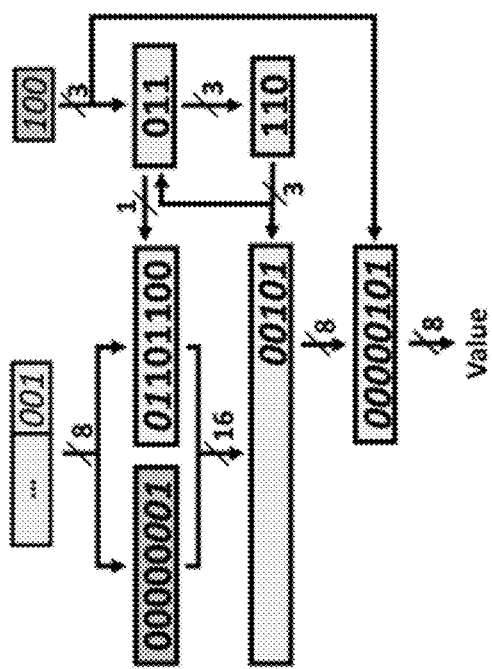
FIG. 9C is an example of a third cycle (iteration) of the decompression module of FIG. 9A.

FIGS. 9B and 9C illustrate examples of cycles 2 and 3 for the above example of the decompression module 122. In cycle 1, the imap buffer supplies the first set of 8b of the input data stream 0110 1100 which are written into register L. Concurrently, W is loaded from the width memory with the datawidth 101 for BBlock 0. OFS is updated to OFS=(OFS+W+1) mod 8=0. Since OFS+W+1 exceeded 8 (carry out from the adder), register R contains no useful bits and thus the positions of register L are register R are swapped at the end of cycle 1 and a read from the imap buffer is triggered for the next cycle. In cycle 2, illustrated in FIG. 9B, the decompression block reads in the next 8b copying them into register L at end of the cycle. Now register L and register R contain two consecutive rows of compressed values from the same hilera; and thus, are now in steady state. During cycle 2, and since OFS is 0, the 16b output of (register L, register R) is shifted by 0; thus, aligning the LSb of the compressed $I_0$ with the LSb of the output. A bit-extension block, upon guidance of W, passes through the lower 6 bits and fills in the upper 2 bits accordingly. In this example, it zero extends the value to 8b since this imap is known to have only positive values. If the layer had signed imap values, the extender block would sign-extend instead. As a result, the value 0010 1100, the original $I_0$ is sent to the multipliers. OFS is updated as before: OFS=(0+5+1) mod 8=6. Since this does not exceed 8, the system will not read a value from the imap buffer in the next cycle. A new width field is read into W by the end of the cycle. This is the width for BBlock 1. In cycle 3, as FIG. 9C illustrates, OFS is used to instruct the shifter to slide the (register L, register R) by 6 positions. The extender block passes through the 5 least significant bits since W is 100 zero-extending to 8b. The OFS can then be updated to (6+4+1) mod 8 and since this exceeds 8, register L and register R will be swapped and the next imap row will be loaded into L in the next cycle.

Once the imap and fmap values for all channels of a layer are processed, the accumulators contain the output map. In most cases, the SCNN reads these values, passes them through the activation function, removes those that are zero, and copies the remaining into the omap buffer (in some cases, it then swaps a pointer so that the omap buffer becomes the imap buffer for the next layer). The system 100 uses the output of the zero compression. The number of values per BBlock can be chosen by a user and/or designer. FIG. 10B shows an example of a compacting block of the compacting module 124, in accordance with the present embodiments, that processes four input values per cycle and where the BBlock size is four.

Figure 10A:
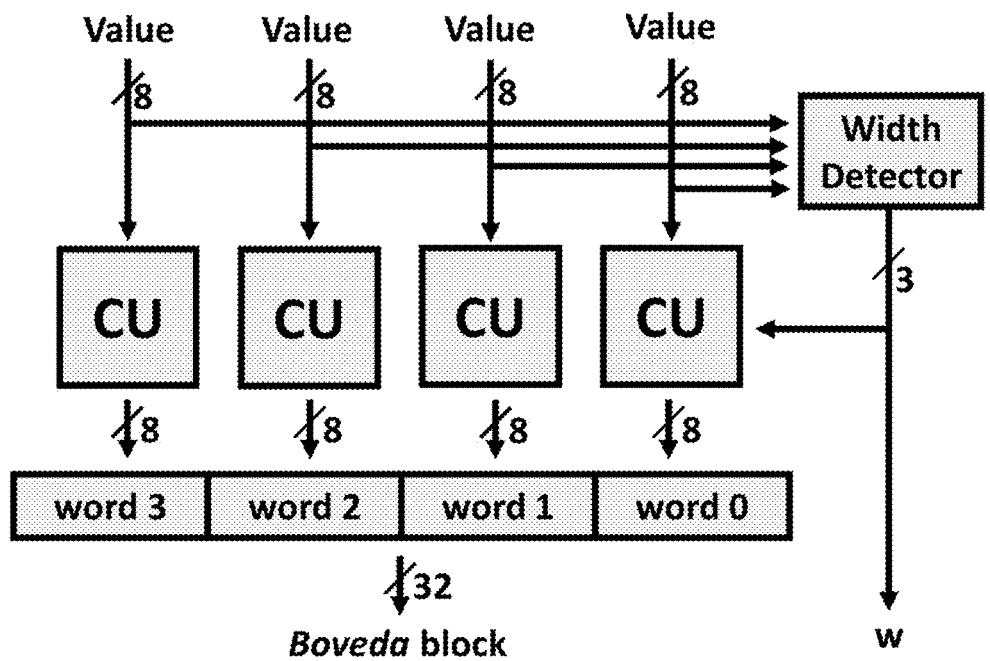
FIG. 10A shows a diagram of an example of a compacting module in accordance with the system of FIG. 1.
Figure 10B:
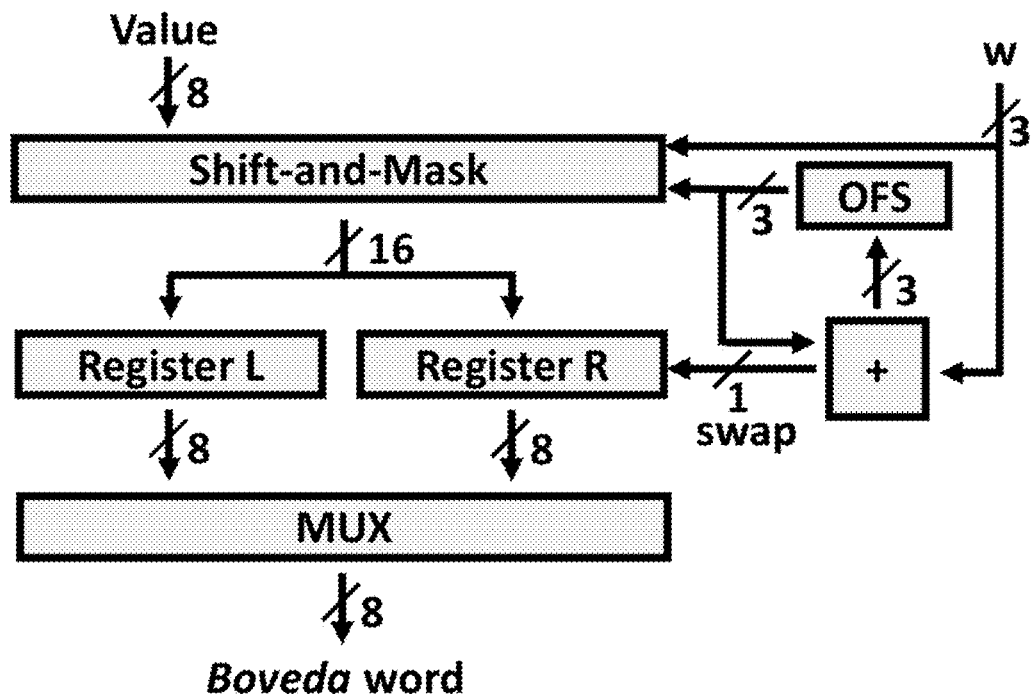
FIG. 10B shows an example structure of a compacting block of the compacting module of FIG. 10A.

FIG. 10A shows that an example of the compacting module 124 can include three major components: (1) a width detector, (2) four compactor units (CUs), and (3) a 32b output register. The compression module reads in four 8b values per cycle and encodes them into a BBlock storing them into the output register. When all 32b of the register are filled in, it sends it to the omap buffer. It is fully capable of producing a full row per cycle. In some cases, it may output buffer rows at a slower pace, since compression can allow it to pack more values per row. For this reason, fewer bits will have to be copied into the imap buffer, advantageously saving energy.

The width detector module 126 identifies the bit width necessary to accommodate the value with the highest magnitude. If, for example, values are assumed to be positive (which is the case when using ReLU), the width detector module 126 first produces 8 signals, one per bit plane each being the OR of all corresponding bits across the four values. The 8 signals then go through a leading-one detector module that identifies the MSb that is 1 amongst all values. This is the width the BBlock needs. When a layer may have signed values, they can be inverted prior to the leading-one detector (for negative numbers, the detector determines if the MSb zero). The width in this case needs one more bit for the sign. Whether a map may negative numbers is known statically. The width detected can be written into the width buffer. Accordingly, for data values that may contain negative values, the values may be signed extended after unpacking based on the value of this sign bit. Positive values may be extended to the full width with zero bits added in the most significant positions, whereas negative values, as determined by a sign bit of one, may be extended using bits of value 1.

FIG. 10B shows the structure of a compacting block of the compacting module 124 that approximately mirrors the decompression module 122. In some cases, there can be one compacting block per hilera. Register L and register R hold the current and the next row for the hilera. Every cycle the compacting block processes a value. It extracts its width (detector) least significant bits and, via the "shift-and-mask" block, stores them into register R at an appropriate position. If the value requires more bits than those currently left unused in register R, the remaining bits are written into register L. When register R fills up it is copied to the output row register (component (3)) and the two registers are swapped using a single bit pointer (not shown). A 3b continuation register specifies at which bit position filling register R should continue. The shift-and-mask block contains an 8b-to-16b shifter and needs to support shifts up to 7 positions to the right; in most cases, the system never needs to shift more than 7 bits since that would mean that register R had no free bits left and thus would have been written out.

In some cases, SCNN can store values in a N.SamplesChannel-Height-Width (NCHVV) order. In this way, SCNN sizes its on-chip buffers so the imap and the omap per layer fit in the on-chip buffers and reads fmaps from off-chip in channel order. When there are multiple tiles, each imap channel is mapped onto the tiles in equally sized portions and the fmaps are broadcast. The imap portion assigned to each tile depends only on the dimensions of the layer. However, since SCNN uses zero compression, the number of imap values contained in each portion will vary. The system 100 can use these properties for compression, which can be used to further compact data. Processing can still start at the beginning of the imap buffer. When values are written at the output of the layer, they are placed starting at the first position of the local omap buffer (each layer SCNN swaps the imap with the omap so that the omap of the preceding layer becomes the imap for the next layer).

The DL module 128, operating with the SCNN, stores the fmaps channel first, packing the values for all fmaps together; first the values for fmap 0, channel 0, then the values for fmap 1, channel 0, and so on. During processing, the tiles cycle through all fmap values for channel 0, then though all for channel 1 and so on. The DL module 128 can determine when it reaches the end of each channel since the fmap dimensions and count are known statically and it can count how many values it processed and how many zeros it skipped.

SCNN uses a per value skip field to remove zeroes. Since the skip fields are used only in the control logic of the tile (e.g., to determine the original positions of values) it may be better to store them into a separate structure next to the control logic rather than close to the datapath. The DL module 128 widens this buffer to also store the per BBlock width fields. In an example, if skip fields of 3b and 8b values are assumed, then the width field requires an overhead of 3b per BBlock, or an overhead in bits of less than 7% when BBlocks of 4 values are used. The overhead halves for BBlocks of 8 values.

Figure 11A:
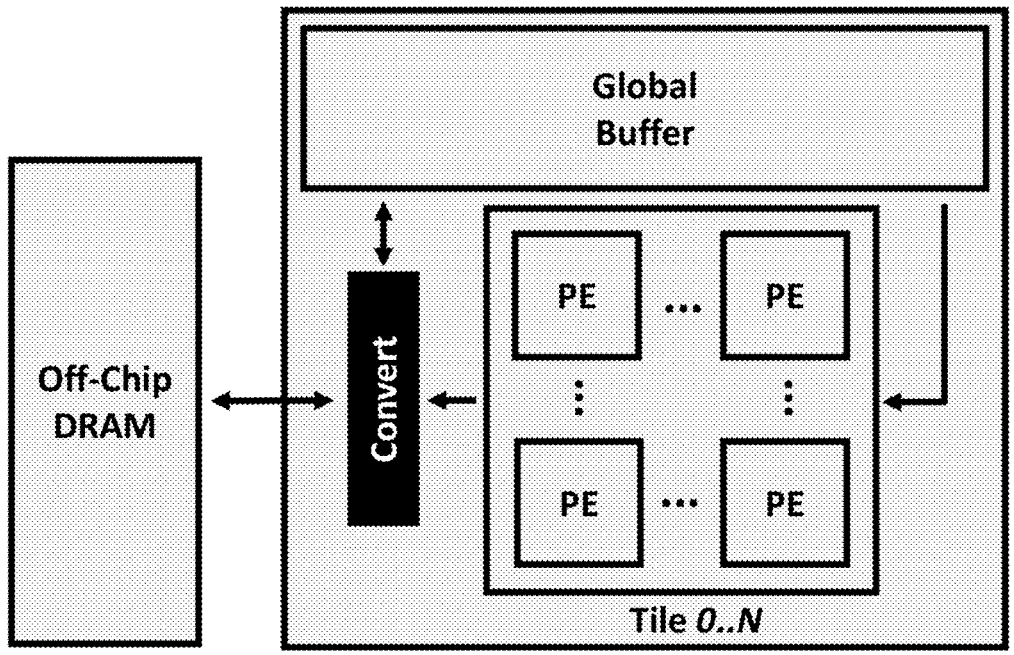
FIG. 11A illustrates an example of the system of FIG. 1 used in a data-parallel accelerator that targets dense models.
Figure 11B:
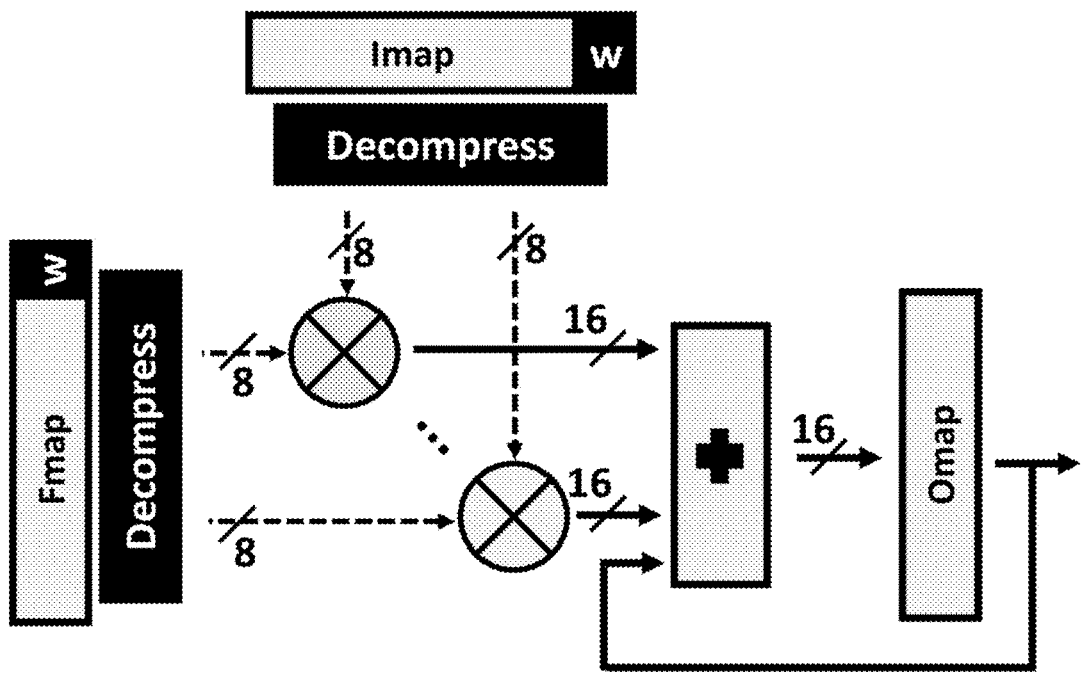
FIG. 11B illustrates an example of a grid of processing elements in accordance with the system of FIG. 1.

FIG. 11A illustrates an example of the system 100 used in a data-parallel accelerator that targets dense models (i.e., it does not exploit sparsity to improve performance). The accelerator has a global buffer to avoid off-chip accesses and a grid of processing elements (PEs). The PEs, illustrated in the example of FIG. 11B, can process 16 (imap, fmap) value pairs per cycle all accumulated to the same omap. Each PE has its own local imap, fmap and omap buffers. If necessary, the convert block first converts values read from off-chip into a useable format prior to writing them into the global on-chip buffer (and vice versa). The PE's local buffers read values from the global buffer at which point they are decompressed. Omap values are compressed before writing them to the global buffer. The width fields are stored in a separate bank and address space of the global buffer.

Compared to a mere SCNN implementation, there are advantageous differences, which, for example, stem in part from the need to support a diverse set of dataflows and in part from the need to support predominantly dense models: (a) on-chip implementations do not implement zero compression; and (b) supporting a diverse set of dataflows requires support for blocking accesses to the imap and the fmap at various levels, and hence being able locate the starting point for each reuse block as needed by the dataflow.

Supporting other dataflows, other than zero compression, requires additional support as the system 100 alters the mapping of values to memory. When all values are of the same length, the system 100 can directly index any value within the imap, fmaps and omap. Since the system 100 compresses these values, their location in memory becomes content dependent. The pointer module 130 can use pointers to support the blocking scheme of the chosen dataflow. Generally, only a few pointers are needed and only a few of them have to be explicitly stored when the data is compressed on-chip or off-chip. Most of the pointers can be generated in a timely fashion while processing and can be discarded once used. This is possible because: (a) dataflows use blocking to maximize reuse, and (b) as processing proceeds according to the dataflow, the system 100 naturally encounters the starting positions for the reuse block that will be processed next. This approach will be described first in the context of a fully-connected layer and then for convolutional layers; where it understood that it can be applied to any suitable layer type.

In most cases, a fully connected layer takes as input one imap and K fmaps and produces an omap having as many elements as fmaps. The imap and the fmaps all have the same number of elements C. Each of the K omap elements is the inner product of the imap with one of the fmaps. The system can take advantage of imap reuse accessing from on-chip. For the purposes of illustration, consider an accelerator having just a single PE. If the imap fits on-chip, it will be possible to read the imap once from off-chip then cycle through the fmaps. In this case, the accesses to the imap and each of the fmaps will be sequential. When the imap is too large to fit on-chip, the system 100 can use blocking, where only a portion of the imap (reuse block) is loaded on-chip at any time while the system cycles through the corresponding portions of the fmaps. The resulting access patterns on-chip remain sequential for each reuse block. Once the system 100 is done processing the current imap reuse block, it can move to the next one. Thus, for fully-connected layers, the system 100 generally only needs to support sequential accesses to relatively long blocks of the imap or the fmaps. When values are not compressed, the starting position of each reuse block is a linear function of the block's size and of its relative position. In most cases, these positions will be dependent on value content. Since the access pattern is sequential, the DL module 128 will arrive at the start of each reuse block in sequence, as required by the dataflow. Thus, in most cases, the pointer module 130 only needs to maintain a single access pointer per fmap and for the imap. When there are multiple PEs, the maps can be partitioned into smaller reuse blocks, which the DL module 128 can process concurrently. The system 100 then needs as many pointers as the number of reuse blocks it is required to process concurrently, which can be stored as additional metadata for the layer.

N.Samples-Height-Width-Channel (NHWC) memory mapping can be used to increase data locality for convolutional layers. Compared to fully-connected layers, the added challenge for convolutional layers is the need to be able to initiate accesses to multiple, often overlapping, windows. Without loss of generality, consider a channel-first output stationary dataflow where each window is processed in channel-width-height order. A term column can be used to refer to all imap values with the same (width, height) coordinates. To determine a single omap, a dataflow can access the values within a column sequentially and then access other columns in width-height order. Boveda can group values into BBlocks sequentially along each column adhering to the NHWC mapping.

A technical challenge for the system 100 is that the starting position of each column will generally no longer be a linear function of its (width, height) coordinates. A naïve solution would be to keep pointers to each column (2D coordinates of the first channel). This is excessive since: (a) each column is needed during the processing of a few windows (e.g., for a 3×3 fmap, each column will be accessed 9 times), and (b) windows typically overlap and thus the starting position of each column will be encountered while processing an earlier window. Accordingly, the pointer module 130 reduces the number of pointers that are explicitly stored as metadata while "recovering" the rest during processing; and keeping them around only as long as necessary. The number of pointers that needed to be stored along the imap depends on the imap and fmap dimensions and the number of windows. In an example, $$\max\left(H \times \left\lceil \frac{\text{windows}}{(H-S+1)} \right\rceil\right)$$

can be used; where H, S, and windows, respectively, are the imap rows, the fmap rows, and the maximum number of windows to process concurrently. For on-chip processing, in most cases, two sets of registers are needed. One for holding the current set of points and one to "recover" the next set. For example, for a layer with an imap of 230×230 imap and a 3×3 fmap, storing around 700 pointers is enough to have more than 200 windows being processed in parallel. Since each fmap is read once per window, the pointer module 130 can also keep a pointer per fmap. The overhead is small, and with the exception of depthwise separable convolutions, even the smallest filters are of 3×3 width and height and several tens of channels deep. In some cases, rather than storing absolute pointers, the pointer module 130 can store a base address and all other pointers as offsets.

To maintain the ability to perform reads as wide as necessary for high PE utilization, the starting positions for some BBlocks can be restricted so that they align with rows in the on-chip memories. In some cases, the first value of every fmap and every S column of the imap (where S is the stride) can be restricted such that they are aligned at the beginning of a memory row. Accordingly, padding may be occasionally needed; however, this padding does not increase footprint compared to not compressing the values, as it minimally reduces the effective compression rate.

The system 100 can be applied on any other layer; such as depthwise separate convolutions and pooling. Since each BBlock can be decoded in parallel, the system 100 may need to store parallelism×blocksize pointers to initiate parallelism operations in parallel.

Besides reduction of pointers overhead, system 100 can reduce group overhead too. Original design uses log 2(bit_width)b of the values to store the BBlock size, but this can be further reduced given the observation that BBlock size value tends to be repeated. System 100 can use an extra bit per BBlock to detect if the size of the BBlock is the same as the previous one, in that case, it doesn't need to read a new size from memory. Hence, a new BBlock size would have an overhead of 1b+log 2(bit_width)b, and repeated sizes an overhead of 1b.

Advantageously, in various embodiments, the system 100 can target inference and is lossless and transparent. It can rely on the expected distribution of all values, and while it benefits from sparsity it does not require it.

Some neural networks exhibit spatial correlation of values and this results in values that are in the same BBlock having similar magnitudes. In such cases it is advantageous to perform a function upon the values to reduce the amount of data needed to be stored. For example, it may be advantageous to first express all values as a difference from a common bias value. A good choice for the bias is for example the maximum value within the BBlock or a constant. When the differences are of much smaller magnitude than the original values, this approach results in fewer bits used per packed value. The bias can be stored in an extra optional field. Functions other than difference may be used.

Some neural networks use a floating point representation of numbers. The representation uses a triplet (sign, exponent, mantissa). For example, a popular representation uses 32 bits where the sign is 1 b, the exponent 8b and the mantissa 23b. The method can be used to dynamically adjust the length of the exponent after removing the bias. For example, for a block of four floating point values (a,b,c,d) where the exponents are respectively Ea, Eb, Ec, and Ed, the encoded block can store instead (Ea-Bias, Eb-Ea, Ec-Ea, Ec-Ed). The width field in this case encodes the number of bits needed to represent the maximum of the values in the encoded block. The Bias is a constant defined by the floating-point standard. A set of adders after decoding can recover the original block (Ea, Eb, Ec, Ed) after the (Ea-Bias, Eb-Ea, Ec-Ea, Ec-Ed) where decoded. During compression a subtractor prior to the compression unit can calculate (Ea-Bias, Eb-Ea, Ec-Ea, Ec-Ed) given the original (Ea, Eb, Ec, Ed) and the Bias. Optionally, mantissas can be stored using a global common width without requiring an extra width field.

Other approaches, such as an Efficient Inference Engine (EIE), use deep compression to drastically reduce fmap sizes for fully-connected layers. Deep Compression is very specialized as it alters the fmap to use a limited set of values (for example, 16), and uses Huffman encoding and lookup tables to decode values at runtime. In contrast, the system can operate on "out-of-the-box" neural networks.

In other approaches, such as compressing DMA, use of a bit vector per block can be used to remove zero values off-chip. In contrast, in various embodiments, the system can target on-chip compression and all values. In other approaches, such as Extended BitPlane Compression (EBPC), off-chip compression can be used that combines zero-length encoding with bit-plane compression; particularly for pruned models. EBPC's decompression module requires 8 cycles per block of eight 8b values. In contrast, in various embodiments, the system can benefit from both dense and sparse networks and decompresses a block per cycle. In other approaches, such as ShapeShifter, off-chip compression can be used that adapts the data container to value content and uses a zero bit vector. ShapeShifter's containers are stored sequentially in memory space with no regards to alignment. Decompression per block is done sequentially for a value at a time per block. Accordingly, ShapeShifter is not appropriate for on-chip compression. Other approaches, such as Diffy, extends ShapeShifter by storing values as deltas. Diffy targets computational imaging neural networks where the imap values exhibit high spatial correlation. Diffy is significantly more computationally expensive than embodiments of the system as encoding and decoding require calculating deltas. In other approaches, such as Proteus, values can be stored on-chip and off-chip using profile-derived per layer data widths; thus it cannot exploit the lopsided distribution of the values within the layer and the maximum magnitude per layer dictates the width for all its values. Embodiments of the present system can be used to adapt the data width at a substantially finer granularity.

Figure 3:
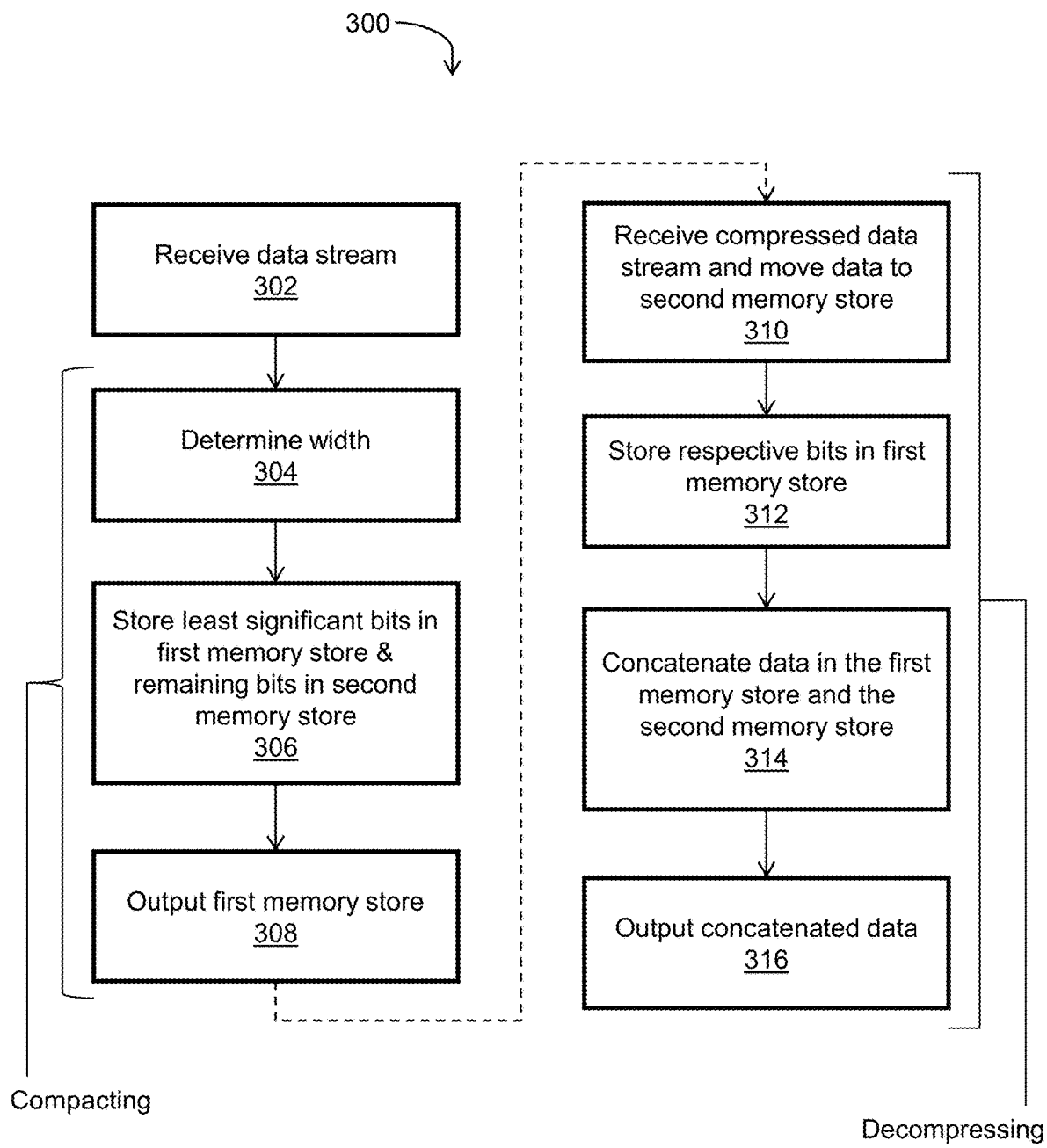
FIG. 3 is a flow chart of a method for memory compression for deep learning networks, in accordance with an embodiment.

FIG. 3 illustrates a flowchart for a method 300 for memory compression for deep learning networks, according to an embodiment.

At block 302, the input module 120 receives an input data stream to be processed by one or more layers of a deep learning model.

At block 304, the width detector module 126 determines a bit width necessary to accommodate the value from the input data stream with the highest magnitude.

At block 306, the compacting module 124 stores a least significant bits of the input data stream in a first memory store (e.g., register 'R'). The number of bits equal to the bit width. If the value requires more bits than those currently left unused in the first memory store, the remaining bits are written into a second memory store (e.g., register 'L').

At block 308, the compacting module 124 outputs the value of the first memory store, as a consecutive part of a compressed data stream, with an associated width of the data in the first memory store when the first memory store becomes full. The compacting module 124 copies the value of the second memory store to the first memory store.

At block 310, the decompression module 122 receives data from the compressed data stream having a respective width and moves the data from a first memory store to a second memory store, where the first memory store contains previously stored data from the compressed data stream.

At block 312, the decompression module 122 stores respective bits of the compressed data stream into the first memory store having a length equal to the width of the first memory store.

At block 314, the decompression module 122 concatenates the data in the first memory store and the second memory store.

At block 316, the decompression module 122 outputs the concatenated data, the concatenated data having a width equal to an associated width of the concatenated value received from the compressed data stream.

The present inventors conducted example experiments to evaluate the technical advantages of the present embodiments. In the example experiments, a custom cycle-accurate simulator was used to model execution time and energy. The simulator used DRAMSim2 to model off-chip memory accesses. All accelerators and hardware modules were implemented in Verilog, synthesized with the Synopsys Design Compiler and laid out with Cadence Innovus for a TSMC 65 nm cell library due to licensee constraints. Power was estimated via Innovus using the circuit activity reported by Mentor Graphics ModelSim. CACTI was used to model the area and power of the on-chip memories. All accelerators operated at 1 GHz matching CACTI speed estimate for the on-chip memories. TABLE 1 lists the network models studied and the footprint for the fmaps and the imaps. Most models were quantized to 8b. Several models use more aggressive quantization. Originally, these models were developed in conjunction with specialized architectures.

to the baseline. Boveda uses memory to store: a) the encoded values, b) the per BBlock width metadata, c) padding due to memory alignment, d) pointers. On average, the system reduces footprint to 49%. SSD-MobileNet and MobileNet see the least benefit of 16%, which is still considerable given that off-chip accesses are an order of magnitude more expensive. Models with specialized quantization are highlighted in FIG. 12A to demonstrate the ideal memory footprint, where the memory hierarchy was designed specifically for them. The system reduces their footprints to within 4% of what is ideally possible. In the case of ResNet18-PACT, the system reduces footprint much more than what would have been possible on 4b hardware. This is because the system takes advantage of actual value content.

The system increases the information content per bit of on-chip storage. Accordingly, the processing engines need to fetch less data from the on-chip hierarchy. FIG. 12B shows a chart illustrating this reduction in traffic. Without the

TABLE 1

| Network | Dataset | Application | Data Type | Pruned | Specialised Q |
|---|---|---|---|---|---|
| BERT[1, 14] | MRPC[43] | NLP | int8 | | |
| GNMT[45, 48] | WMT 2016 | NMT | int8 | | |
| SegNet[8] | CamVid[9] | Segmentation | int8 | | |
| Bi-dir LSTM[44] | Flickr8k[37] | Captioning | int8 | | |
| AlexNet-Q[25] | ImageNet[41] | Classification | int8 | | |
| ResNet18-Q[19] | ImageNet[41] | Classification | int8 | | |
| SSD-MobileNet [28, 38] | COCO[27] | Object Detection | int8 | | |
| MobileNet[21, 38] | ImageNet[41] | Classification | int8 | | |
| ResNet18-INQ[47] | ImageNet[41] | Classification | int4(log)/16 | | ✓ |
| ResNet18-PACT[12] | ImageNet[41] | Classification | int4/int8 | | ✓ |
| MobileNetV2-OA[32] | ImageNet[41] | Classification | int4/int8 | | ✓ |
| ResNet50S-OA[32] | ImageNet[41] | Classification | int3/int8 | ✓ | ✓ |
| AlexNet-MIT[46] | ImageNet[41] | Classification | int8 | ✓ | |
| GoogLeNet-MIT[46] | ImageNet[41] | Classification | int8 | ✓ | |
| AlexNet-Intel[33] | ImageNet[41] | Classification | int16 | ✓ | |
| GoogLeNet-Intel[33] | ImageNet[41] | Classification | int16 | ✓ | |
| ResNet50-Intel[33] | ImageNet[41] | Classification | int16 | ✓ | |

The example experiments demonstrated that the present embodiments delivered the highest memory benefits possible without requiring method-specific hardware. These models include:
- Intel's INQ, whose fmap values are limited to sixteen signed powers of two or zero. Representing weights as magnitudes requires 16b, whereas 5b were enough with specialized hardware.
- PACT, which requires a modified ReLU with a configurable saturation threshold and used 4b imaps and fmaps for all but the first and the last layer, which used 8b. Outlier-Aware quantisation aggressively reduced the number of bits for most values (e.g., 4b), except for a few large values (outliers of 8b) that were handled separately.
- Intel's Skim Caffe repository and MIT's Eyeriss group, since SCNN generally excels for pruned models.

The example experiments included examining the system with respect to a dense model accelerator with 256 processing engines organized in 16×16 rows. Each processing engine performed 8 MACS in parallel producing a single value. Each PE had 64-entry imap, fmap, and omap buffers. The system used a BBlock size of 8. A 32-bank global buffer supplied the processing engines.

Figure 12A:
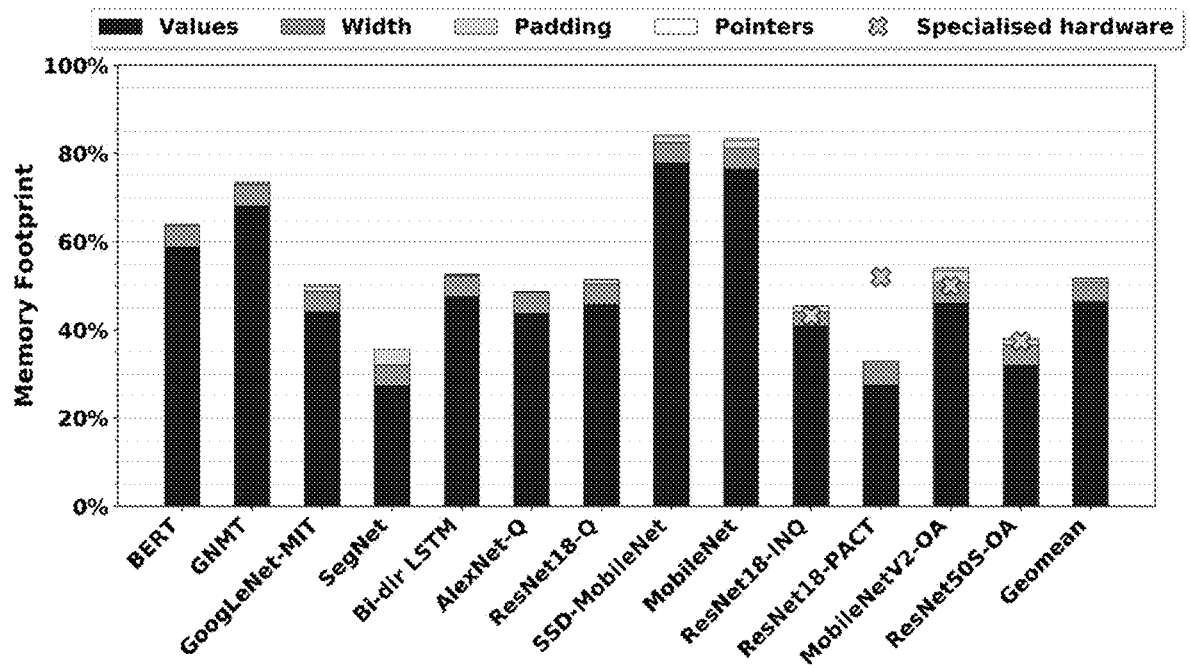
FIG. 12A illustrates a chart reporting the memory footprint for a whole neural network for example experiments.
Figure 12B:
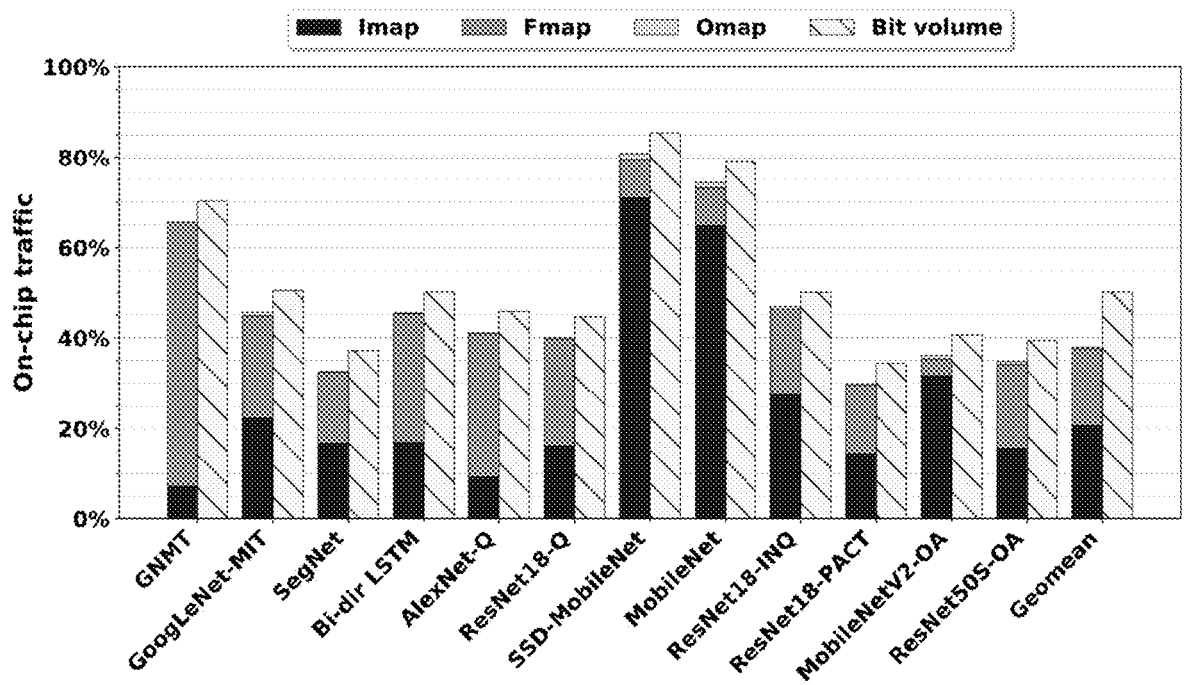
FIG. 12B shows a chart illustrating this reduction in traffic for the example experiments.

FIG. 12A illustrates a chart reporting the memory footprint for the whole neural network. Footprint is measured in bits and the figure reports footprint with the system relative system, an access only reads data whereas with the system, an access may also read metadata. Accordingly, two measurements are shown: a) accesses, and b) bits transferred. Both are normalized to the baseline. The system performed 62% fewer transfers on average and transfers 50% fewer bits in total. As expected, the bulk of the accesses were for the fmaps and imaps. The reduction in bit traffic were less than the reduction in accesses due to the metadata. The trends observed are similar to those for overall footprint. This reduction is directly translatable into energy savings.

A major design choice when architecting accelerators is the amount of on-chip storage to use. Larger on-chip memory reduces the frequency of data fetches from off-chip. For example, SCNN's on-chip buffers were sized so that it rarely had to spill the feature maps off-chip. The example experiments studied four policies for sizing the on-chip capacity. Being able to fit: a) the imap, omap and the fmaps for the largest layer, b) the fmaps and a full row of windows from the imap, and c) a full row of windows from the imap and an fmap per processing engine. With policy (a), only the input and the final output went off-chip. With policy (b), there was a guarantee per layer that each value is accessed once from off-chip. With policy (c), there was a guarantee that a single access per layer only for the imap and the omap. Also considered was (d) layer fusion, which processes subsets of several layers without going off-chip for the intermediate i/omap values.

Figure 13A:
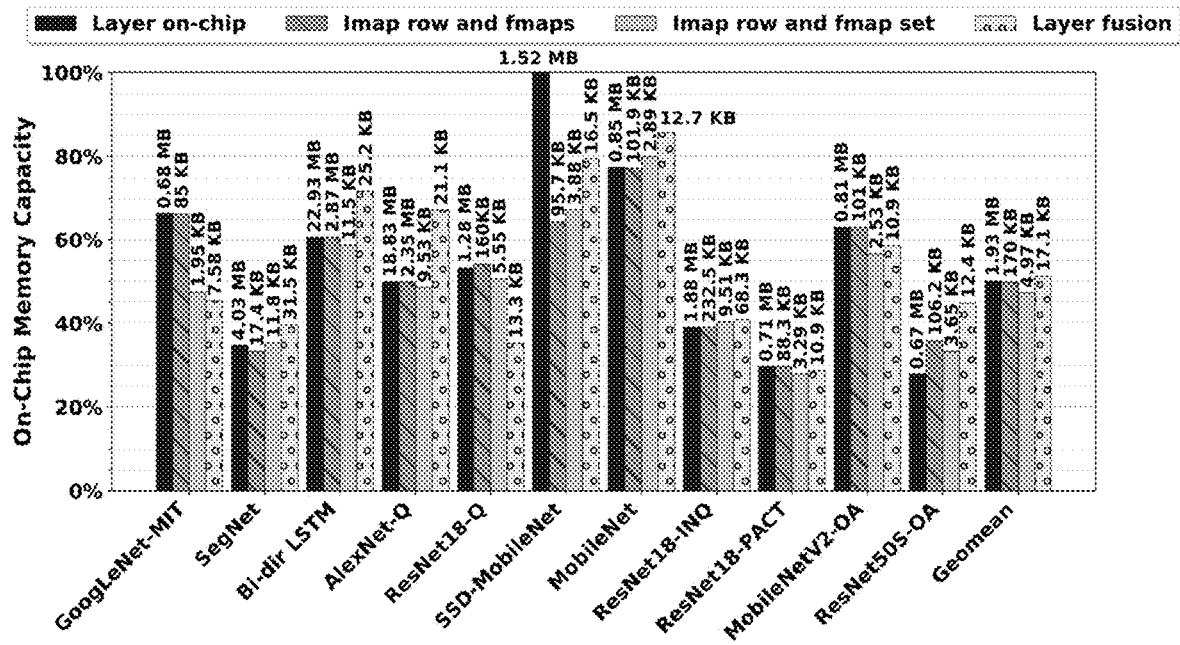
FIG. 13A is a chart illustrating on-chip memory capacity needed under each sizing policy for the example experiments.
Figure 13B:
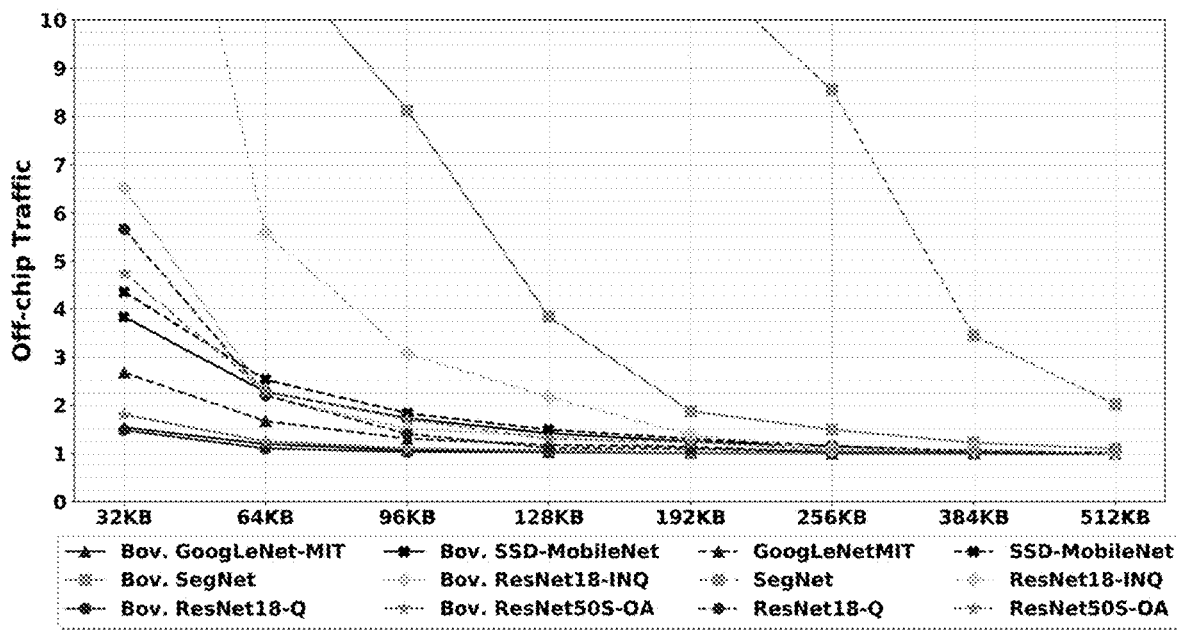
FIG. 13B shows a chart illustrating off-chip traffic per model for the example experiments.

FIG. 13A is a chart illustrating on-chip memory capacity needed under each sizing policy, above. Capacities were normalized to a baseline under the same policy (it is different per policy). Overall, the reduction in storage needs followed the compression rates closely. In one case, SSD-MobileNet with the first policy (full layer on-chip) had no reduction possible. There was a single layer for which the system did not reduce overall on-chip data volume. There were energy and performance benefits regardless since the system reduced overall model traffic and footprint. Regardless of the access policy used, the system reduced how often the accelerator had to go off-chip. FIG. 13B shows a chart illustrating off-chip traffic per model with the system (solid lines) and without (dotted lines). For clarity, only a subset of the networks are shown. Traffic was normalized so that, where possible, every value was accessed once per layer. As the on-chip memory size increased, traffic approached this minimum. The system allows for the use smaller on-chip memories. Moreover, for a given memory capacity, the system reduces off-chip traffic. For example, in the case of SegNet, even 512 KB of on-chip storage was not enough to achieve minimal traffic without use of the system. With 32 KB of on-chip storage, the system reduces off-chip traffic by 3.8× for ResNet18 (traffic with the system is 1.48× and 5.66× without vs. reading values once) and by 2.6× for ResNet50S OA.

Figure 14A:
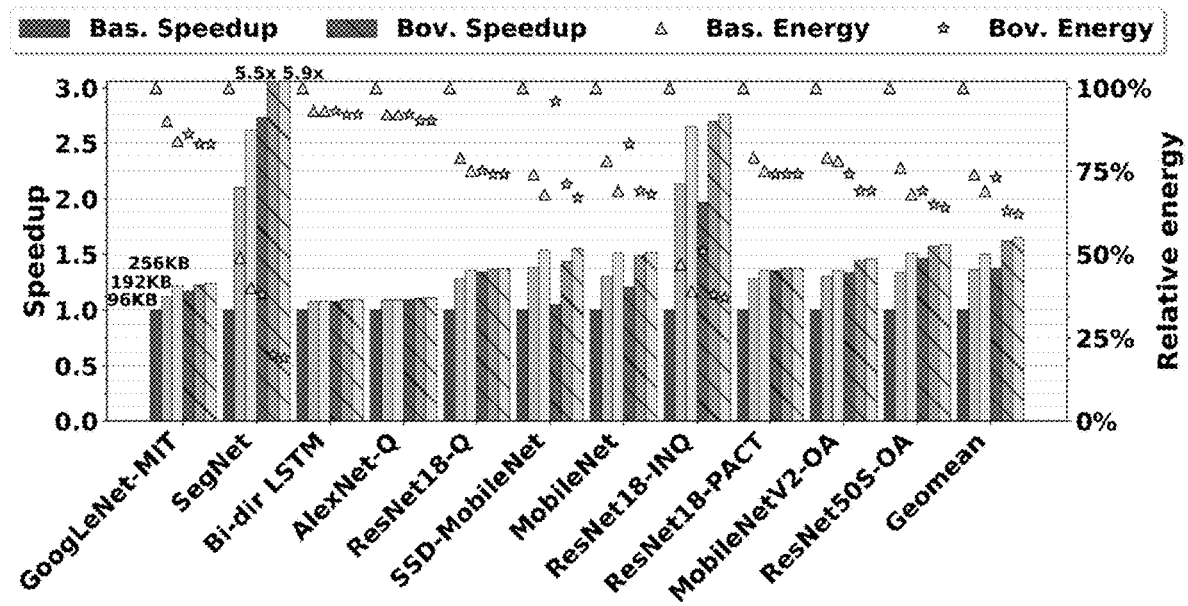
FIG. 14A shows a chart illustrating speedups normalized to a baseline for the example experiments.

The example experiments measured performance for three configurations with on-chip global buffers of 96 KB, 192 KB, and 256 KB. All used DDR4-3200 dual-channel off-chip memory. FIG. 14A shows a chart illustrating speed-ups normalized to the baseline with the 96 KB global buffer. The system improves performance by 1.4×, 1.2× and 1.1× on average, respectively. Improvements are the highest for SegNet whose convolutional layers are rather large and where the system compresses data considerably. Benefits of the system are also pronounced for MobileNetV2-OA, MobileNet, and ResNet18-INQ where the system manages to avoid spilling off chip for several layers. Since the on-chip hierarchy of the system can sustain peak execution bandwidth for the baseline, performance benefits with the system can come from reduced off-chip traffic. FIG. 14A also shows relative energy for the same memory configurations. The system saves 28%, 16% and 10% of the energy on average for the 96 KB, 192 KB and 256 KB configurations, respectively. These benefits are due to less off-chip and on-chip traffic. As the on-chip capacity increases, off-chip accesses reduce and so does their overall energy cost.

TABLE 2 reports area and power for the compression and decompression. The width detector module 126 is shared per BBlock. Total area overhead is 6.7%, 3.8%, and 3.2% for the 96 KB, 192 KB, and 256 KB on-chip configurations. However, if this area is spent in extra memory for the baseline, the system is still 1.29×, 1.15×, and 1.1× faster on average, and is slightly more energy efficient since on-chip accesses for the baseline become slightly more expensive.

TABLE 2

|  | BBlock | Area (um²) 8b | Area (um²) 16b | Power (mW) 8b | Power (mW) 16b |
| --- | --- | --- | --- | --- | --- |
| Width detector | 4 | 109.8 | 247.68 | 0.042 | 0.498 |
|  | 8 | 199.08 | 447.48 | 0.054 | 0.652 |
| Compressor | — | 288.36 | 710.64 | 0.238 | 0.470 |

Figure 14B:
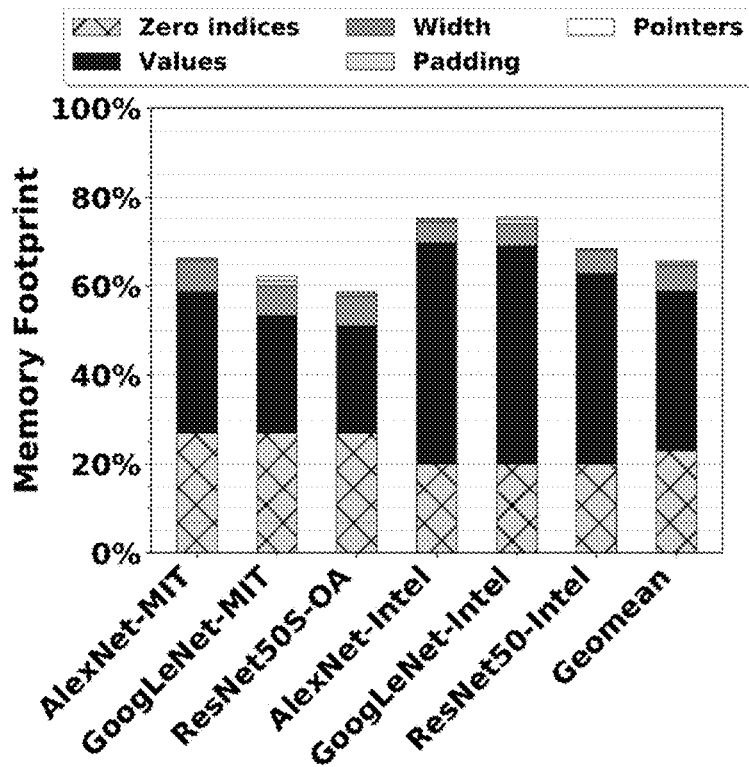
FIG. 14B shows a chart illustrating the reduction in total model footprint for the example experiments.

SCNN used zero compression on-chip and off-chip. For 16b networks, SCNN used 4b zero skip indexes. In the example experiments, the system used 3b indexes instead for the 8b networks to reduce metadata overhead. It was found that doing so does not affect the number of zeros that are eliminated. The system, in this case, does not compress the zero skip indexes. FIG. 14B shows a chart illustrating the reduction in total model footprint using the system over SCNN's zero compression. The system reduces memory footprint by an average of 34% relative to zero compression. SCNN generally sizes its on-chip memory to fit all imaps on-chip for AlexNet, and GoogLeNet. This configuration results in larger networks such as ResNet50 spilling data off-chip. Furthermore, the accumulator size limits the number of omap values and the number of concurrent filters as a result. By amplifying on-chip storage capacity, the system reduces spills. These effects were studied over three different per PE imap/accumulator configurations: 10 KB/6 KB as in SCNN; 4 KB/4 KB; and 2 KB/2 KB. The off-chip memory used two channels of DDR4-3200. The area overhead for these configurations was 3.1%, 2.3% and, 1.8%, respectively for SCNN 16b. Overheads are smaller for SCNN 8b.

Figure 15A:
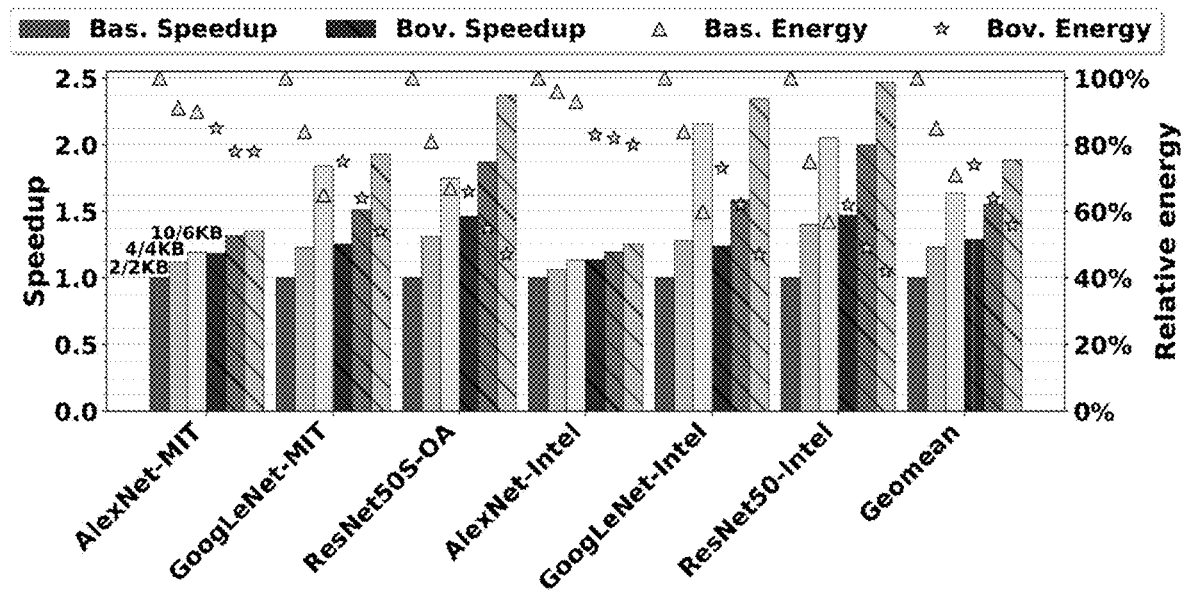
FIG. 15A shows a chart illustrating speedup for the example experiments.

FIG. 15A shows a chart illustrating speedup over the 2 KB/2 KB configuration with and without use of embodiments of the system. For the 2 KB/2 KB configuration, the system improved performance by 29%. The improvement with the system was more pronounced for the more recent ResNet50 models as their imaps are larger. With 10 KB/6 KB, the system improved performance by 15%. FIG. 15A shows that energy is reduced by 26%, 24%, and 20% on average respectively for the three configurations. The example experiments shows that the system always reduced energy. Compute-bound models, such as GoogLeNet or ResNet50, saw more benefits since on-chip traffic accounts for a higher fraction of overall energy.

Figure 16A:
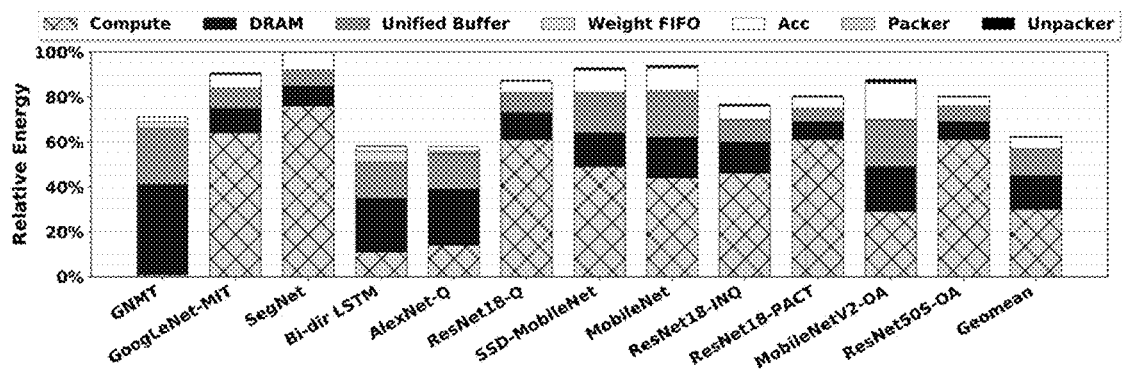
FIG. 16A is a chart illustrating the memory energy breakdown for the example experiments.

The example experiments demonstrated that the system can also benefit first generation tensor processing unit (TPU). The TPU incorporated 28 MB of on-chip imap memory and streamed the fmaps from an off-chip DRAM with a weight stationery dataflow. A 256×256×8b systolic array computed the omaps. The Fmaps were kept compressed in DRAM and the on-chip buffers decompressing them just the before the systolic array. Similarly, the imaps were kept compressed in the on-chip DRAM and are decompressed by the Systolic Data Setup unit. FIG. 16A is a chart illustrating the memory energy breakdown for TPU with and without the system for BBlocks of 16. The system on top of the TPU had a negligible area overhead of less than 0.1%.

Figure 16B:
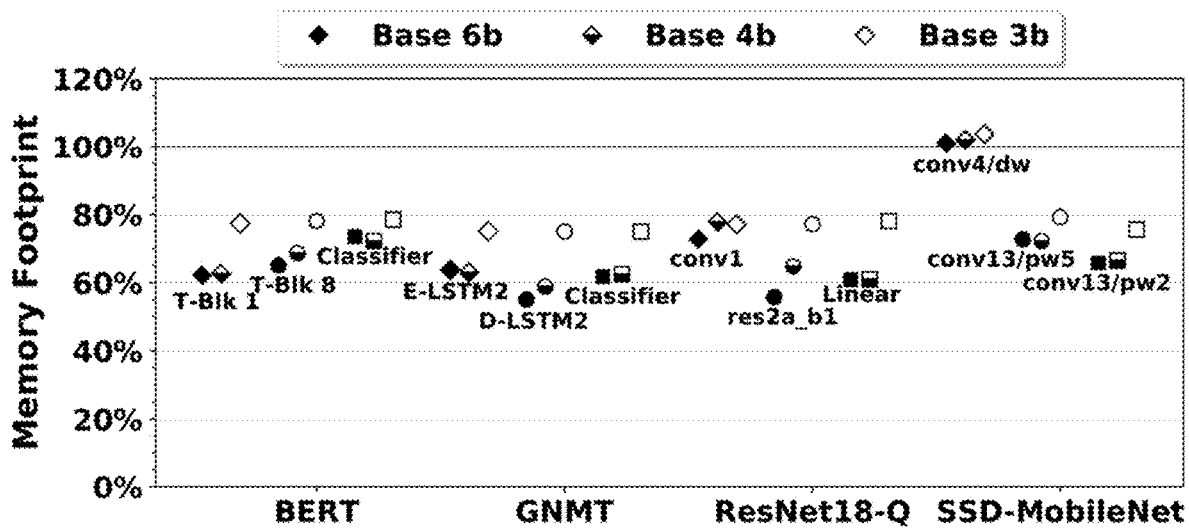
FIG. 16B is a chart showing ideal compression rates in view of the example experiments.

While initially models used 16b fixed-point, 8b is standard today for many models. To further investigate the system's potential effectiveness for narrow datatypes across a broader set of models, the example experiments generated synthetic 6b, 4b, and 3b networks by scaling existing 8b layers to fewer bits while maintaining the original relative distribution of values (linear quantization). FIG. 16B is a chart showing ideal compression rates for a representative subset of these layers compressed in BBlocks of 8. The results show that the system remains effective for 4b layers. For 3b layers, occasionally, the system fails to reduce footprint or even expands it, but generally still provides computational advantages.

In general, the system's compression rate depends on the value distribution and is given by:

$$Comp. = 1 - \frac{\sum_{bl=Bmin}^{Bmax} P(X = bl) \times bl + \frac{\lceil \log_2(Bmax) \rceil}{B\,Block}}{Bmax}$$

where Bmax is the maximum bit length, P(X) the probability to have a certain bit length given by the value distribution, and Bmin is 2 for signed values and 1 otherwise. For signed values, maximum compression is achieved when P(X=2)=1. For 3b and a group size of 8, maximum compression is limited to 25%, while for 4b it is limited to 43.75%. The above formula does not take into account the overhead of padding and pointers which depends on the dataflow, accelerator, and layer dimensions.

Figure 17:
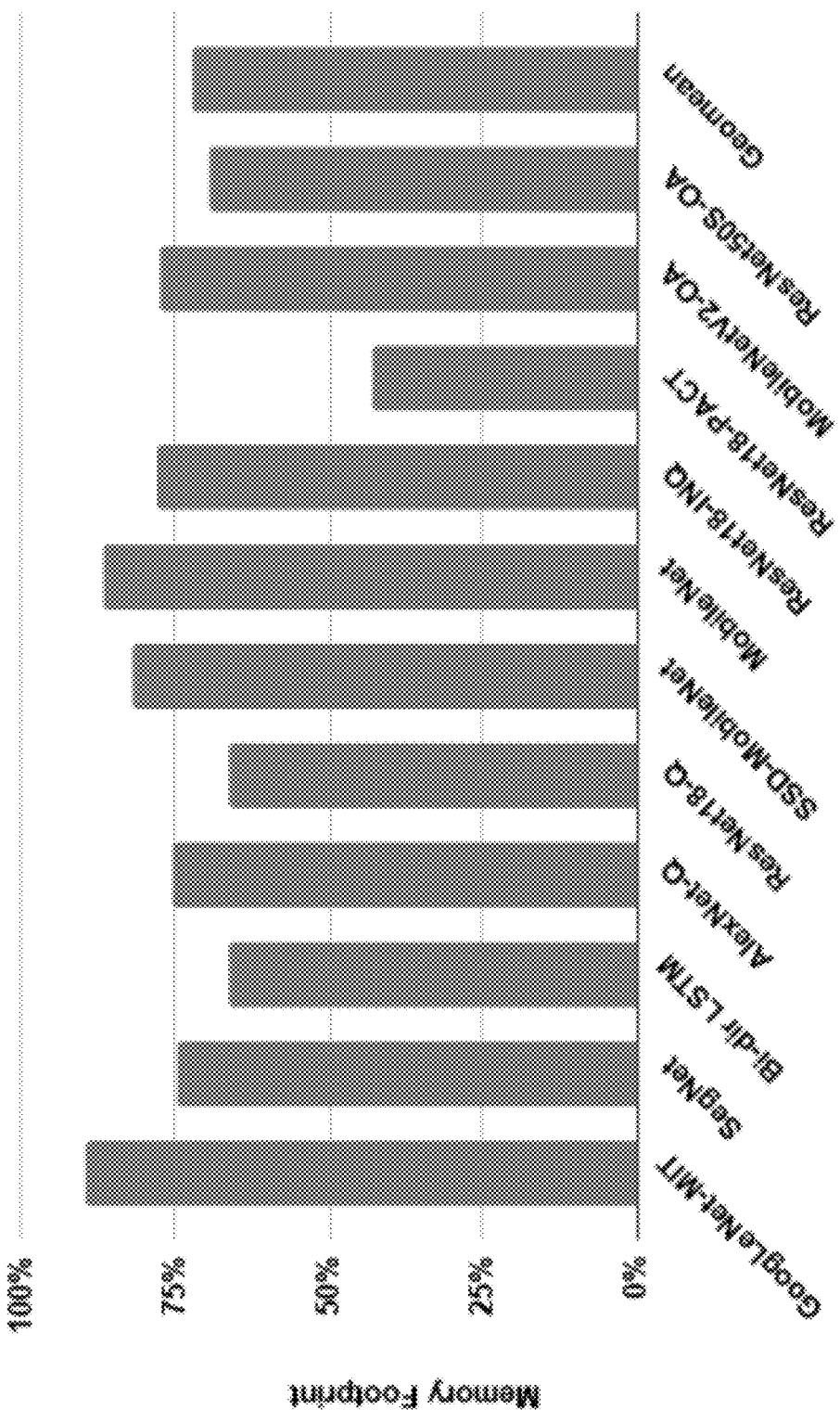
FIG. 17 is a chart showing a comparison of various showing memory footprint reduction for optimised bit width size overhead.

FIG. 17 is a chart showing footprint reduction for optimised BBlock size overhead. On average, repeated group optimisation reduces BBlock size overhead by 28% on average. ResNet18-PACT finds the best reduction at 58% since BBlock size for 4b values are more likely to be repeated.

Figure 15B:
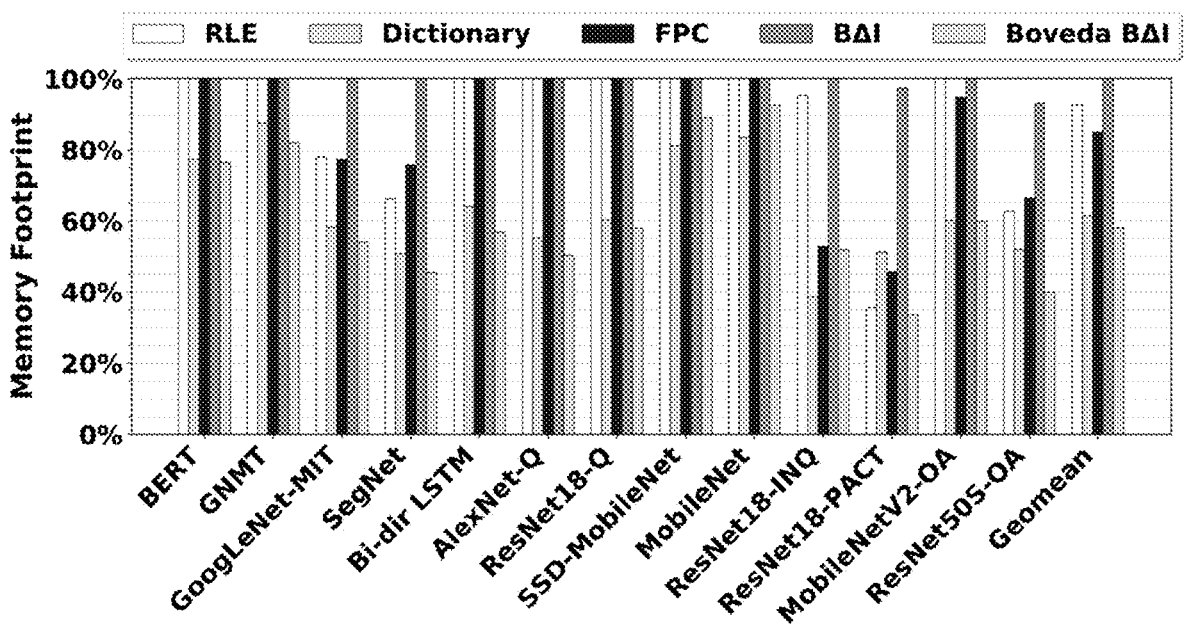
FIG. 15B is a chart showing footprint reduction for the example experiments.

FIG. 15B is a chart showing footprint reduction for Frequent Pattern Compression (FPC) and Base-Delta-Immediate (BΔI), which are cache compression schemes for general purpose systems. Both target value width in addition to other properties. FPC was motivated by the observation that the programmers tend to use 32b variables with no regard to the actual value range they need. FPC detects whether values can be stored in power of two sized containers (4b being the smallest). On average it reduces footprint by 18%. This is mostly from removing zeros. BΔI exploits the low-dynamic range of values in programs (neighbouring values tend to be close in value). It operates on chunks of 64 bytes and reduces width at a byte granularity. It represents values as deltas of 4, 2, or 1 bytes from either zero or the first value of 8, 4, or 2 bytes. All zero chunks are represented as 1 byte plus metadata. This byte granularity is too large for neural networks. At best it reduces footprint by 7% ResNet50S-OA where it takes advantage of zero values.

The example experiments evaluated a variant of the system, the system-BΔI, which incorporates elements from BΔI: it applied the per value compression method of BΔI but at a smaller granularity. The compression options were: all bits are zero and delta sizes of 8b, 4b, and 2b. It packed values in hileras so that decompression can be processed in parallel and without requiring a large crossbar at the output. The base was set to be always 1 byte, while the working set of values was reduced to BBlocks of 8. The system, using BΔI, achieved 44% compression on average; ignoring the overheads of width and pointer metadata. This is close to what the system, without using BΔI, achieves. However, decompressing values with the system using BΔI was considerably more complex and required more energy. For example, decompressing a block needs 8 additions in parallel, plus broadcasting the base across all of them. Compression is also more involved: it performs all compression possibilities in parallel before choosing the best. The system without BΔI both achieves a better compression rate and is simpler to implement.

In addition, the example experiments were compared to run-length encoding and dictionary-based compression that also exploit value content. Run-length encoding was limited to 8 values and the dictionary table to 8 entries to avoid prohibiting overheads for 8b values. Both of these approaches, when compared to the system, achieved lower compression rate while requiring an expensive crossbar for decompression.

The example experiments illustrate that the present embodiments are easy to implement and provide an effective on-chip compression technique for neural networks. They reduces on-chip traffic while boosting the effective on-chip capacity. As a result, they reduce the amount of on-chip storage needed to avoid excessive off-chip accesses. Moreover, for a given on-chip storage configuration, they reduce how often off-chip accesses are needed.

Although the invention has been described with reference to certain specific embodiments, various modifications thereof will be apparent to those skilled in the art without departing from the spirit and scope of the invention as outlined in the claims appended hereto.

We claim:

1. A method for memory compression for a deep learning network, comprising:
   defining, for a first memory of a deep learning network, a plurality of rows each having a specified number of columns, each column having a column width;
   receiving an input data stream to be processed by one or more layers of the deep learning network, the input data stream having a plurality of values of a fixed bit width;
   dividing the input data stream into subsets, the number of values in each subset being equal to the number of columns;
   compressing the data stream by sequentially compacting each subset, comprising:
      identifying, for values within the subset, a compressed bit width that accommodates the value with the highest magnitude;
      storing the bit width in a bit width register associated with the row;
      storing, in the respective column of the memory beginning from a first unoccupied bit, a least significant bits of each value within the subset, the number of bits equal to the bit width, wherein if storing the number of bits requires more bits than those currently left unused in the respective column of the respective row, the remaining bits are written into the respective column of a subsequent row; and
   wherein the compressed data stream can be decompressed to reproduce the input data stream by:
      identifying a location of a first unread bit of each column of the compressed data stream;
      sequentially outputting the reproduced input data by:
         obtaining the bit width of each subset from the respective bit width register;
         retrieving from each column of the first memory, beginning at the first unread bit of the column, the number of bits corresponding to the bit width and outputting the retrieved bits to the least significant bits of an output;
         updating the location of the first unread bit of each column to correspond to the bit location subsequent to the retrieved bits;
         zero or sign extending remaining most significant bits of the output to obtain the reproduced input data value.

2. The method of claim 1, wherein the location of a block of compressed values can be located by one or more pointers.

3. The method of claim 2, wherein the block is a filter map data block or an input or output activations data block.

4. The method of claim 2, wherein the location is for the first compressed value of the block.

5. The method of claim 2, wherein the one or more pointers comprise a first set of pointers to data for input or output activations maps and a second set of pointers to data for filter maps.

6. The method of claim 2, wherein receiving an input data stream comprises sequentially receiving portions of the block beginning at the location of the one or more pointers, compressing the portion of the block, and updating an offset pointer for recalling the next portion to be received.

7. The method of claim 2, wherein receiving an input data stream comprises sequentially receiving portions of the block, wherein a location for each portion is identified by one of the pointers.

8. The method of claim 2, wherein a portion of the compressed data values are forced to be stored starting at the least significant bit of a column by padding unoccupied most significant bits of a preceding data value.

9. The method of claim 1, wherein the bit width register for some rows stores a binary representation of the length of the bit width.

10. The method of claim 9, wherein the bit width register for other rows stores a single bit designating whether the bit width of the corresponding row is the same or different than the previous row.

11. The method of claim 1, wherein the method is used to store floating point values, the floating point values comprising a sign portion, and exponent portion and a mantissa portion, the input data stream consisting of the exponent portions of the floating point values, and wherein compressing further comprises, for each floating point value, storing the sign portion and mantissa portion adjacent to the compressed exponent portion.

12. The method of claim 1, wherein during decompression a pointer is established for the location of a particular one of the blocks that is known to be needed at a future time.

13. The method of claim 1, further comprising tracking a next unoccupied location in each column of the first memory while compressing and storing the values.

14. The method of claim 1, further comprising initializing a first storage location of the first memory as being unoccupied prior to compressing the data stream.

15. The method of claim 1, wherein the plurality of values are of a fixed bit width less than or equal to the column width.

16. The method of claim 1, wherein the reproduced data stream is output directly to an arithmetic/logic unit.

17. The method of claim 1, wherein the reproduced data stream is output to a second memory having a plurality of rows each having a plurality of columns corresponding to the first memory.

18. The method of claim 1, wherein compressing further comprises prior to identifying the compressed bit width, evaluating a function on the values of the input data stream to reduce the compressed bit width and reversing the function for decompression.

19. A system for memory compression for a deep learning network, comprising:

a first memory having a plurality of rows each having a specified number of columns, each column having a column width;

an input module for:
receiving an input data stream to be processed by one or more layers of the deep learning network, the input data stream having a plurality of values of a fixed bit width; and
dividing the input data stream into subsets, the number of values in each subset being equal to the number of columns;

a width detector module having a plurality of bit width registers each associated with a row, the width detector module identifying, for values within the subset, a compressed bit width that accommodates the value with the highest magnitude and storing the bit width in the bit width register associated with the row;

a compacting module for storing, in the respective column of the memory beginning from a first unoccupied bit, a least significant bits of each value within the subset, the number of bits equal to the bit width, wherein if storing the number of bits requires more bits than those currently left unused in the respective column of the respective row, the remaining bits are written into the respective column of a subsequent row; and a decompression module for decompressing the compressed data stream to reproduce the input data stream by:
identifying a first unread bit of each column of the compressed data stream;
sequentially outputting the reproduced input data by:
obtaining the bit width of each subset from the respective bit width register;
retrieving from each column of the first memory, beginning at the first unread bit of the column, the number of bits corresponding to the bit width and outputting the retrieved bits to the least significant bits of an output;
updating the first unread bit of each column to correspond to the bit location subsequent to the retrieved bits;
zero or sign extending remaining most significant bits of the output to obtain the reproduced input data value.

20. The system of claim 19, further comprising a pointer module having one or more pointers for tracking the location of a block of compressed values.

* * * * *